(12) United States Patent
Kim et al.

(10) Patent No.: US 7,679,972 B2
(45) Date of Patent: Mar. 16, 2010

(54) HIGH RELIABLE AND LOW POWER STATIC RANDOM ACCESS MEMORY

(75) Inventors: Jinsook Kim, Sunnyvale, CA (US);
Nian Yang, Mountainview, CA (US);
Hung-Jen Lin, Sunnyvale, CA (US);
Sachit Chandra, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 11 days.

(21) Appl. No.: 11/942,526

(22) Filed: Nov. 19, 2007

(65) Prior Publication Data
US 2009/0129172 A1 May 21, 2009

(51) Int. Cl.
*G11C 7/10* (2006.01)
(52) U.S. Cl. ............... 365/189.05; 365/203; 365/230.06
(58) Field of Classification Search ............ 365/189.05, 365/203, 230.06
See application file for complete search history.

(56) References Cited

U.S. PATENT DOCUMENTS

| | | | | |
|---|---|---|---|---|
| 5,768,215 A | * | 6/1998 | Kwon et al. ............. | 365/238.5 |
| 6,084,822 A | * | 7/2000 | Maeda ................... | 365/189.05 |
| 6,826,081 B2 | * | 11/2004 | Nagashima et al. .... | 365/185.09 |
| 7,099,213 B2 | * | 8/2006 | Ju .............................. | 365/203 |
| 7,224,624 B2 | * | 5/2007 | Lee et al. ............... | 365/189.05 |
| 7,292,474 B2 | * | 11/2007 | Iino et al. ............. | 365/185.03 |
| 7,330,372 B2 | * | 2/2008 | Hosono et al. ......... | 365/185.12 |
| 2008/0049497 A1 | * | 2/2008 | Mo ........................ | 365/185.03 |

* cited by examiner

*Primary Examiner*—Viet Q Nguyen
(74) *Attorney, Agent, or Firm*—Turocy & Watson, LLP

(57) ABSTRACT

Systems and/or methods that accessing data to/from a memory are presented. A memory component can employ an optimized buffer component that can provide a single precharge control signal to facilitate precharging a bitline(s), a y-decoder component(s), an input/output line(s), and/or other lines or components associated with a buffer cell(s) in the optimized buffer component to facilitate optimized timing control associated with execution of operations to facilitate reducing errors that can be caused by charge sharing problems. The optimized buffer component can include an x-decoder component that can employ a JIT power component that can facilitate enabling a wordline associated with a buffer cell(s) only for the length of time access to the buffer cell is desired to read data therefrom or write data thereto to facilitate minimizing the access time and thereby minimize power consumption and/or thermal loading.

20 Claims, 12 Drawing Sheets

HIGH RELIABLE AND LOW POWER STATIC RANDOM ACCESS MEMORY

TECHNICAL FIELD

The subject innovation relates generally to computer/device memory controllers, methods, and/or systems and more particularly to computer/device random access memories, controllers, methods, and/or systems for enablement of higher reliability, lower error, and lower power consumption computer/device random access memories.

BACKGROUND

Traditionally, data access related to a memory device (e.g., a flash memory device, among others) is often implemented by employing tree-type decoders to efficiently use chip area. To mitigate memory component malfunctions (e.g., data access errors, among others) due to parasitic electronic effects (e.g., charge sharing, among others), conventional memory devices (e.g., flash memory devices, among others) require very accurate timing control signals to precharge the data access lines (e.g., bitlines, nodes in tree-type decoders, I/O lines, . . . ) before executing memory operations (e.g., read, write, refresh, erase, . . . ) by precisely estimating the parasitic electronic effects of related components (e.g., bitlines, wordlines, decoders, I/O lines, . . . ) within the memory device. It has been common practice to employ multiple precharge condition control signals and precharge condition charge outputs to account for the parasitic electronic effects (e.g., potential charge sharing, resistance, . . . ) among data access lines (e.g., bitlines, nodes in tree-type decoders, I/O lines, . . . ). This has conventionally increased the complexity of the timing scheme for the multiple precharge condition control signals and precharge condition charge outputs and can be related to increases in the malfunction of memory devices (e.g., data access errors, among others) resulting from failures to effectively manage the complex timing scheme employed in correspondingly complex memory device designs.

Computer memory systems have grown in complexity as higher volumes of memory have become available in ever decreasing package sizes. As the memory density has increased, power consumption and heat dissipation have become increasingly problematic parameters. Further, computing systems continue to be driven by a desire for faster processing, resulting in ever decreasing temporal windows for data access and compression of the signaling scheme used for data input and output (I/O) and thus, precisely choreographed signaling with very low error tolerances has become increasingly desirable.

Generally, information can be stored and maintained in one or more of a number of types of storage devices, such as memory devices. Memory devices can be subdivided into volatile and non-volatile types. Volatile memory devices generally lose their information if they lose power and typically require periodic refresh cycles to maintain their information. Volatile memory devices include, for example, random access memory (RAM), dynamic RAM (DRAM), static RAM (SRAM), and the like. Non-volatile memory devices can maintain their information whether or not power is maintained to the memory devices. Non-volatile memory devices include, but are not limited to, flash memory, read only memory (ROM), programmable ROM (PROM), erasable PROM (EPROM), electrically erasable PROM (EEPROM), non-volatile RAM, and the like.

The use of portable computer and electronic devices has greatly increased demand for high memory capacity, efficient, and reliable memory devices. Digital cameras, digital audio players, personal digital assistants, and the like, generally seek to employ large capacity memory devices (e.g., flash memory, smart media, or compact flash, among others). The increased demand for information storage can be commensurate with memory devices having an ever-increasing storage capacity (e.g., increase storage per die or chip). For example, a postage-stamp-sized piece of silicon can contain tens of millions of transistors, with each transistor as small as a few hundred nanometers.

The memory cells of a memory device (e.g., a nonvolatile memory core, a volatile memory core, a nonvolatile buffer, or a volatile buffer, among others) can typically be arranged in an array. A memory cell (e.g., a core cell or a buffer cell, among others) can be placed at each intersecting row and column in an array. Typically, a particular memory cell can be accessed by activating its row and then writing the state of its column or reading the state of the particular memory cell. Memory sizes can be defined by the row and column architecture. For example, a 1024 row by 1024 column memory array can define a memory device having one megabit of memory cells. The array rows can be referred to as wordlines and the array columns can be referred to as bitlines.

In memory cells, one or more bits of data can be stored in (e.g., a write) and read (e.g., a read) from respective memory cells. The memory operations (e.g., core operations or buffer operations, among others) to access memory cells and data associated therewith can be commonly performed by application of appropriate voltages to certain terminals of the memory cells. In a read or write operation the voltages can be applied so as to cause a charge to be removed, stored, or sensed in/from a charge storage layer of the memory cell.

The trend in semiconductor memory devices has been toward higher circuit density with higher numbers of bit cells per device, lower operating voltages, and higher access speeds. To achieve these high densities there have been, and continue to be, efforts toward scaling down device dimensions (e.g., at sub-micron levels). However, as the desired scaling down of device dimensions occur, certain undesirable electronic effects can be increasingly problematic. It is desirable to scale down the size of memory devices while reducing or minimizing these undesirable electronic effects and maintaining and/or improving the functionality of such memory devices.

Errors in signal timing can propagate as a failure to properly manage multiple timing signals related to a memory device. These timing errors can produce logic failures and result in errors in the access of data on a memory device. Conventional memory devices are becoming increasingly complex in relation to signal timing as additional timing considerations are made to accommodate larger memory capacities, more dense memory device designs, and to overcome increasingly problematic parasitic electronic effects associated with scaling to more compact and dense memory devices.

Moreover, even where management of multiple signals is properly conducted, errors in data access can propagate as a result of engineering design errors and failures to account for the physical properties of a memory device (e.g., memory devices can have parasitic electronic effects such as, for example, capacitance, resistance, inductance, excessive time constants due to size, metal trace placement, orientation, and/or materials selections for device fabrication, among others, that can negatively impact proper data access in a memory device). Conventionally, addressing high density memory devices involves utilizing many data access lines (e.g., bitlines) and many access enable lines (e.g., wordlines) in close proximity. Many of these data access lines and access enable lines can have parasitic components to neighboring conductors (e.g., power rails, switched signal lines, other data access lines, . . . ) due to their proximity, often resulting in negative effects on data access, for example, cross talk or undefined signal levels, among others, and can result in reading/writing/refreshing/erasing data improperly. For example, it is inherently complex to determine small differential changes in signal levels on data access lines (e.g., bitlines) when measuring from an undefined state that can vary widely across a memory device. As memory systems become increasingly small and increasingly dense on the shrinking semiconductor real estate, parasitic electrical effects similarly can become increasingly problematic and can often result in lower quality memory or lower yield of satisfactory memories from a production process.

Methods and systems to reduce error propagation due to parasitic effects can add significant value to a memory system. Further, methods and systems to reduce timing signal complexity and ruggedness against parasitic electronic effects can also add significant value to a memory system.

A second issue in modern high density memory devices is power consumption. High power consumptions, even where temperature parameters are forgiving, are becoming increasingly less desirable as computing devices increasingly become independent of steady and enduring power supplies (e.g., battery powered devices such as laptop computers, cellular telephones, and personal digital assistants can be highly power conscious; future computing systems depending on "transmitted power" schema can likely be highly power conscious). Further, conventional memory devices, even where higher power consumption could be tolerated where wall or mains power sources were available to provide a surplus of power can be more environmentally friendly.

Additionally, where power density is high, thermal considerations are of serious concern in the industry. For example, the temperature in the core of a modern computer processor, if not properly managed, can easily destroy or severely damage the processor. Therefore, lower power consumption to reduce thermal issues is becoming more of a concern for high density memory products. Further, wicking thermal load can be insufficient to maintain favorable operating conditions at high performance levels in dense electrical systems. Other thermal management techniques can be of limited use or cost prohibitive. Reducing thermal loading by reducing power consumption can provide an avenue to optimize existing computer memories at comparatively low expense.

It is desirable to create simplified and robust systems and methods for temporal signaling within computer memory products to decrease error propagation and to simplify signal management. Further, it is desirable to efficiently manage power consumption to reduce overall power consumption and thermal loading in computer memory products.

SUMMARY

The following presents a simplified summary of the subject innovation in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

In accordance with one aspect of the disclosed subject matter, a memory component (e.g., flash memory, among others) can be comprised of a plurality of memory locations (e.g., core memory cells) in which data can be accessed (e.g., read, written, refreshed, erased, . . . ). In an aspect, the memory locations can each be comprised of various semiconductor layers (e.g., oxide layer(s), silicon-rich/-poor silicon-nitrite layer(s), polysilicon layer(s), metal/metalized layer(s), among others) that can facilitate trapping and storing of electron charges in the memory location, where the amount of stored charge in the memory location can represent and correspond to a data value of the data being accessed (e.g., written, read, refreshed, erased, . . . ) in the memory location. The memory component can include a predetermined number of sectors that can each include a subset of memory locations. The memory locations can be accessed (e.g., read, write, refresh, erase, . . . ) by applying predetermined voltage levels related to the particular memory operation to respective data access lines (e.g., bitlines) and access enable lines (e.g., wordlines) that can be associated therewith and/or predetermined voltage levels to a substrate associated therewith. A buffer can be employed to facilitate accessing data in the plurality of memory locations.

In accordance with an aspect of the disclosed subject matter, a memory component can comprise, for example, a non-volatile memory core, a volatile optimized buffer component, a precharge component, and a just-in-time power component (hereinafter JIT or JIT power component), among others. A memory core can be used to store and/or retrieve data communicated to/from a memory component through an I/O component. The optimized buffer component can facilitate accessing data (e.g., read, write, refresh, erase, . . . ) during memory operations (e.g., read, write, refresh, erase, . . . ) between the memory core and the I/O component, for example, the optimized buffer component can be employed to prevent over or under runs during a write operation to the memory core component.

In accordance with another aspect of the disclosed subject matter, the optimized buffer component can include a precharge component that can be employed to facilitate reducing error propagation from parasitic elements on data access lines (e.g., a SRAM memory component Bitline (BL) and Bitlinebar (BLB) data access line) that carry data into or out of a buffer cell in the optimized buffer component. Reduced error propagation can be accomplished by precharging data access lines (e.g., bitlines) to predetermined charge potentials in response to a precharge control signal before conducting a memory operation relating thereto.

Conventionally, precharging of a plurality of locations (e.g., bitlines between a y-tree decoder, decoded paths through a y-tree decoder, bitlines between a y-tree decoder and a I/O component, . . . ) on a memory device employed a plurality of precharge control signals (e.g., a control signal for each precharge location) to effect separate precharge conditions at the respective locations, resulting in a complicated timing scheme and related error propagation from mismanagement of the timing scheme. In accordance with an aspect of the disclosed subject matter, the precharge component can facilitate simplified and robust temporal signaling to reduce timing scheme complexity and related error propagation in memory components (e.g., flash memory devices, among others). For example, the precharge component can facilitate providing (e.g., generating) a single precharge component control signal (hereinafter PCB) that can be employed to facilitate effecting a precharge condition at a plurality of locations related to data access (e.g., bitlines between a y-tree decoder, decoded paths through a y-tree decoder, bitlines between a y-tree decoder and a I/O component, ... ) within an optimized buffer component, and can thereby facilitate reducing error propagation associated with mismanagement of timing schema by simplifying timing complexity, as compared to conventional memory devices.

The disclosed subject matter also relates to systems and/or methods that facilitate reduced power consumption and reduced thermal loading by use of Just-In-Time (JIT) power designs. Conventionally, the main power dissipation in a memory cell can be current flowing along a data access line(s) (e.g., bitlines) through transistor(s) in a memory cell when the memory cell is conductively coupled to the data access line(s) in response to enabling an access enable line(s) (e.g., a wordline). In accordance with an aspect of the disclosed subject matter, a JIT signal component can facilitate reduced power consumption by enabling an access enable line (e.g., a wordline) only when access to a memory location is germane to proceeding with a memory operation. This can result in the data access line(s) (e.g., the bitline(s)) being conductively coupled to the memory location for a reduced period of time as compared to conventional systems and can result in lower power consumption. For example, a JIT signal component can enable an access enable line (e.g., wordline) only when, for example, a WRITE ENABLE signal and/or a READ ENABLE signal are simultaneously enabled with an enabled ADDRESS signal, indicating that a memory operation is ready to proceed. Therefore, additional power is not consumed (e.g., current is not flowing between a bitline and memory cell) by connecting (e.g., in response to enabling wordline) the memory cell to the data access line (e.g., bitline) before the memory operation is ready to proceed. Reduced power consumption can also facilitate reduced thermal loading, as compared to conventional memory devices.

To the accomplishment of the foregoing and related ends, the innovation, then, comprises the features hereinafter fully described and particularly pointed out in the claims. The following description and the annexed drawings set forth in detail certain illustrative embodiments of the innovation. These embodiments can be indicative, however, of but a few of the various ways in which the principles of the innovation can be employed. Other objects, advantages, and novel features of the innovation will become apparent from the following detailed description of the innovation when considered in conjunction with the drawings.

DETAILED DESCRIPTION

Figure 1:
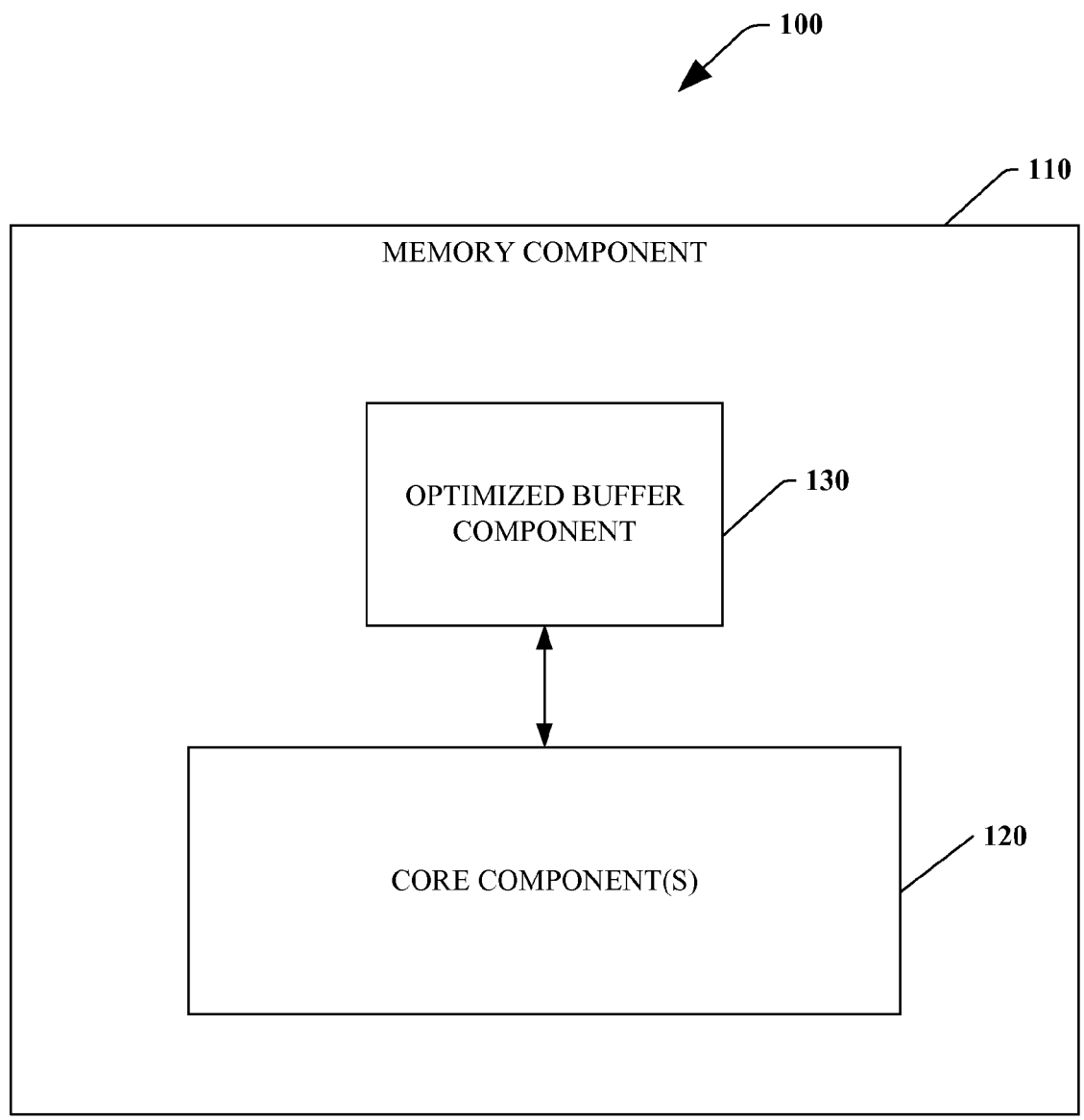
FIG. 1 is a high level diagram of a system that can facilitate storage and/or access of data associated with a memory in accordance with an aspect of the subject matter disclosed herein.

The disclosed subject matter is described with reference to the drawings, wherein like reference numerals are used to refer to like elements throughout. In the following description, for purposes of explanation, numerous specific details are set forth in order to provide a thorough understanding of the subject innovation. It is evident, however, that the disclosed subject matter can be practiced without these specific details. In other instances, well-known structures and devices are shown in block diagram form in order to facilitate describing the subject innovation.

Modern memory systems have become complex in regard to temporal signaling for memory operations (e.g., read, write, refresh, erase, ... ) to memory cell locations in increasingly dense memory cell arrays to accommodate the electrical phenomena of small scale devices. The complexity of signaling memory operations on a memory device (e.g., flash drive, CF card, ... ) can potentially cause error propagation in a memory operation through failures in management of the complex timing signal scheme necessary to control the number of memory cells in a memory array and/or can cause error propagation in accessing data during a memory operation (e.g., read, write, refresh, erase, ... ) due to failures to account for one or more permutations of parasitic electrical effects as the number of memory cells in a memory array are packed more densely and/or are made smaller to allow higher memory densities.

Further, mere scaling of conventional memory architectures to create higher density memory components can introduce an increasing number of undesired electrical effects (e.g., more memory cells can result in a corresponding increase in the number of signal, control, and data paths associated with a memory array; as electrical components are placed closer together to increase density they can interact parasitically at a higher level with neighboring electrical components; etc.)

Also, power consumption in modern memory systems can be a highly problematic issue as such systems are scaled down in size. For example, as the number of components in a memory device increase and the density of those components increases, power management becomes a correspondingly increasingly important consideration (e.g., as the number of memory cells increases, power consumption can increase in relation to the increase in number of memory cells; also, where the per component power consumption does not decrease as memory cell densities increase, thermal loading can become highly problematic where heat per unit area can force a reduction in heat production or a means of removing that heat from the device; etc.)

Systems and/or methods are presented that can facilitate reducing error propagation in memory systems by simplifying temporal signaling methodologies. Further, systems and/or methods are presented that allow for precharging portions of memory systems (e.g., bitlines, address decoders, I/O lines, ... ) to facilitate reducing error propagation related to parasitic electronic effects. Moreover, systems and/or methods are presented that can facilitate power conservation in memory systems and thereby also reducing thermal loading in memory systems.

The subject innovation is hereinafter illustrated with respect to one or more arbitrary architectures for performing the disclosed subject matter. However, it will be appreciated by one of skill in the art that one or more aspects of the subject innovation can be employed in other memory system architectures and is not limited to the examples herein presented.

Turning to FIG. 1, illustrated is a block diagram of a system 100 that can facilitate storage of and/or access to data associated with a memory in accordance with an aspect of the disclosed subject matter. System 100 can include one or more memory components 110 that can facilitate storage and/or access of data. The memory component 110 can comprise core component(s) 120 having addressable volatile and/or nonvolatile memory (e.g., flash memory) that can facilitate storage and/or access to data. Memory in a core component(s) 120 can be arranged as a memory cell array that can contain a plurality of memory cells, wherein each memory cell can store one or more bits of data (e.g., similar to that shown in FIG. 3).

The memory component 110 can further include an optimized buffer component 130 that can contain an addressable volatile and/or nonvolatile memory (e.g., buffer memory) that can facilitate storing and/or accessing data in memory locations (e.g., buffer cells, such as described herein with regard to FIG. 2) within the optimized buffer component 130 to facilitate storing and/or accessing data associated with the memory component 110 (e.g., in core components). Optimized buffer component memory (e.g., buffer memory) in the optimized buffer component 130 can be arranged as an addressable buffer cell array that can contain a plurality of buffer cells in which one or more bits of data can be stored (e.g., same or similar to that shown in FIG. 3).

Figure 12:
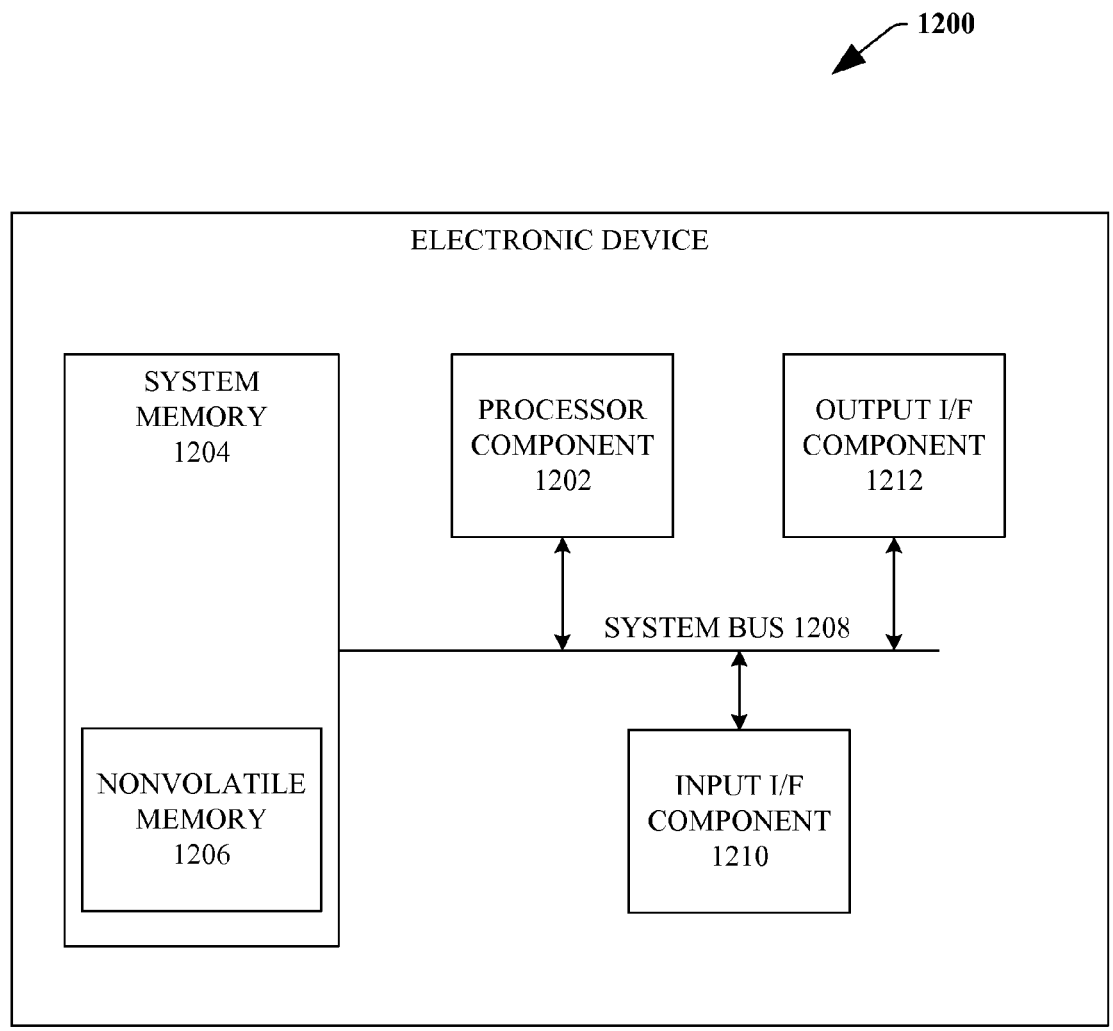
FIG. 12 illustrates a block diagram of an exemplary electronic device that can utilize a memory device(s) in accordance with an aspect of the disclosed subject matter.

The optimized buffer component 130 can be communicatively coupled to core component(s) 120 to facilitate system 100 functionality. For example, an optimized buffer component 130 can facilitate reducing data access over- or under-runs for data access to the core component(s) 120. During write operations, data being written to the core component 120 can be stored in the optimized buffer component 130 until the core component 120 is available to be accessed. During read operations, data can be read from memory cells (not shown) in the core component 120 and can be stored in buffer cells (e.g., illustrated in FIG. 2 and described herein) in the optimized buffer component 130 until another component (e.g., processor component, as illustrated in FIG. 12 and described herein) desiring the read data is available to receive the data from the optimized buffer component 130 in the memory component 110.

Generally, a nonvolatile memory can include, for example, flash memory (e.g., single-bit flash memory, multi-bit flash memory), mask-programmed ROM, programmable ROM (PROM), Erasable PROM (EPROM), Ultra Violet (UV)-erase EPROM, one-time programmable ROM, electrically erasable PROM (EEPROM), nonvolatile random access memory (NVRAM) (e.g., ferroelectric random access memory (FeRAM)), or combinations thereof, among others. Generally a volatile memory can include, for example, random access memory (RAM), dynamic RAM (DRAM), static RAM (SRAM), or combinations thereof, among others.

Parasitic electronic effects can include perturbation of signals or conditions from capacitive coupling, induction, and/or leach resistances, among others. In high density electronic devices, such as memory devices, among others, the close proximity of signal transmission lines (e.g., data access lines such as bitline(s), access enable lines such as wordline(s), power rails, digital switch signal lines, ... ) can result in errors, such as degraded voltage potentials related to a data value, among others, as a result of perturbing parasitic electronic effects. Generally, precharging signal transmission lines to a known charge potential prior to further interacting with the signal transmission lines can reduce the effects of perturbation of the signal lines, for example, precharging a bitline before writing a charge potential related to a data value can reduce degradation of the written charge potential by placing the bitline at a known charge potential prior to the write operation.

In accordance with an aspect of the disclosed subject matter, the optimized buffer component 130 can facilitate reducing error propagation from parasitic electronic effects by precharging portions (e.g., nodes, bitlines, etc.) of an optimized buffer component 130. To facilitate reducing error propagation that can result from parasitic electronic effects, the optimized buffer component 130 can effect a precharge condition on components of the optimized buffer component 130, for example, data access lines (e.g., bitlines of the optimized buffer component 130), a y-decoder component (e.g., a tree-type bitline decoder of the optimized buffer component 130 carrying data to/from buffer cell bitlines, such as more fully described herein with regard to FIG. 2), I/O bitlines (e.g., bitlines of the optimized buffer component 130 carrying data between an I/O component and a y-decoder component), and/or combinations thereof, among others. Precharging can result in a known initial state of the data access lines to facilitate reduced error during buffer memory operations (e.g., read, write, refresh, erase, ... ) related thereto, as compared to buffer memory operations from an unknown initial state that can, for example, result in incorrect data values, strong surge currents, or operation regimes that can invert transistors, among others.

In another aspect, the optimized buffer component 130 can facilitate a reduction in error propagation by reducing timing signal complexity associated with precharging portions (e.g., signal path(s), y-decoder component, etc.) of the optimized buffer component 130.

Conventionally, precharging of portions of a memory (e.g., buffer component) when executing operations in a memory can be performed by applying a plurality of precharge control signals to respective regions of the memory to effect a precharge condition at each region of the memory to be precharged (e.g., control signal A can effect a precharge of a bitline, control signal B can effect a precharge of a tree-decoder, and control signal C can effect a precharge of an I/O signal line.)

In large arrays of memory, this plurality of precharge control signals and the temporal management thereof can be highly complicated. This can result in errors both from mis-management of the timing to effect proper precharging (e.g., the timing scheme design is flawed as a result of the complex nature of designing the timing scheme) and in errors in timing signal propagation due to, for example, timing signal latency (e.g., even where the timing scheme is well designed, the control signal to effect precharging may not arrive in the proper temporal region due to latency in the control signal transmission line.)

In one aspect, the optimized buffer component 130 can reduce the number of precharge control signals (hereinafter PCBs), as compared to conventional memory systems or devices. In an aspect, the optimized buffer component 130 can employ one PCB that can be used to effect a precharge condition on portions of the optimized buffer component 130. By utilizing one PCB signal to effect a precharge condition across portions of the optimized buffer component 130 (e.g., precharging bitlines, y-decoder component(s), and I/O lines associated with a buffer cell(s)), the complexity of a timing scheme can be reduced in comparison to a conventional system (e.g., design and implementation of a timing scheme can be easier, testing of the timing scheme can be more thorough, and/or there can be a reduction in errors associated with performing a proper timing scheme across the precharge regions, among others).

In another aspect, power consumption of the system 100 during memory operations (e.g., read, write, refresh, erase, . . . ) can be reduced, as compared to conventional systems. Conventionally, power can be expended in a memory operation at a buffer cell by current flowing between a data access line(s) (e.g., bitlines) and buffer cell transistor(s) when the buffer cell is connected to the data access line(s) in response to enabling an access enable line(s) (e.g., a wordline). For example, wordline can be enabled as part of a conventional write operation such that a buffer cell is conductively coupled to data access lines (e.g., bitlines) independent of the readiness of the memory operation to proceed with actually writing the data from the bitlines into the buffer cell (e.g., a wordline can be unnecessarily enabled and power expended while waiting for data to be loaded from an I/O buffer onto an I/O bitline, a y-decoder decoding the bitline to connect the appropriate buffer memory cell to the I/O bitline, and/or the buffer memory cell bitline to be loaded with data through the y-decoder as part of a write operation).

To facilitate a reduction in power consumption during a memory operation, the optimized buffer component 130 in an aspect can enable an access enable line(s) of the optimized buffer component 130 (e.g., wordline) only for the period of time when enablement of the access enable line(s) of the optimized buffer component 130 is germane to the memory operation proceeding (e.g., wordline is enabled only when the memory operation is ready to proceed). In an aspect of the disclosed subject matter, the optimized buffer component 130 can enable a wordline during a write operation, for example, only when an ADDRESS signal and WRITE ENABLE signal are enabled, such that the wordline can be enabled connecting the bitline to the buffer cell such that the write operation can proceed (e.g., wordline is not enabled before data is loaded from the I/O buffer, a buffer memory cell address is decoded, and data is loaded onto the buffer memory cell bitlines). In another aspect, for example, during a read operation, the optimized buffer component 130 can enable a wordline only when an ADDRESS signal and READ ENABLE signal are enabled, such that the wordline can be enabled connecting the bitline to the buffer cell such that the read operation can proceed to read the data from the buffer cell. This can reduce the length of time that the wordline is enabled, similarly reducing the length of time that the buffer cell of the optimized buffer component 130 is conductively coupled to the bitlines and thereby reducing the length of time in which power is consumed by passing current between the bitlines and the buffer cell transistors, resulting in reduced power consumption, as compared to conventional memory systems.

By reducing power consumption, thermal loading of the system 100 can be significantly reduced, as compared to conventional memories. Conventionally, power expended in an electronic circuit can result in thermal loading. Where thermal loading is not balanced by removal of the heat, damage and/or reduced performance can occur. By reducing power expended during a memory operation (e.g., write, read, refresh, erase, . . . ), an optimized buffer component 130 can reduce heat generated at the optimized buffer component 130 and thereby reduce thermal loading of the optimized buffer component 130, and improving the performance of the optimized buffer component 130 of system 100.

Figure 2:
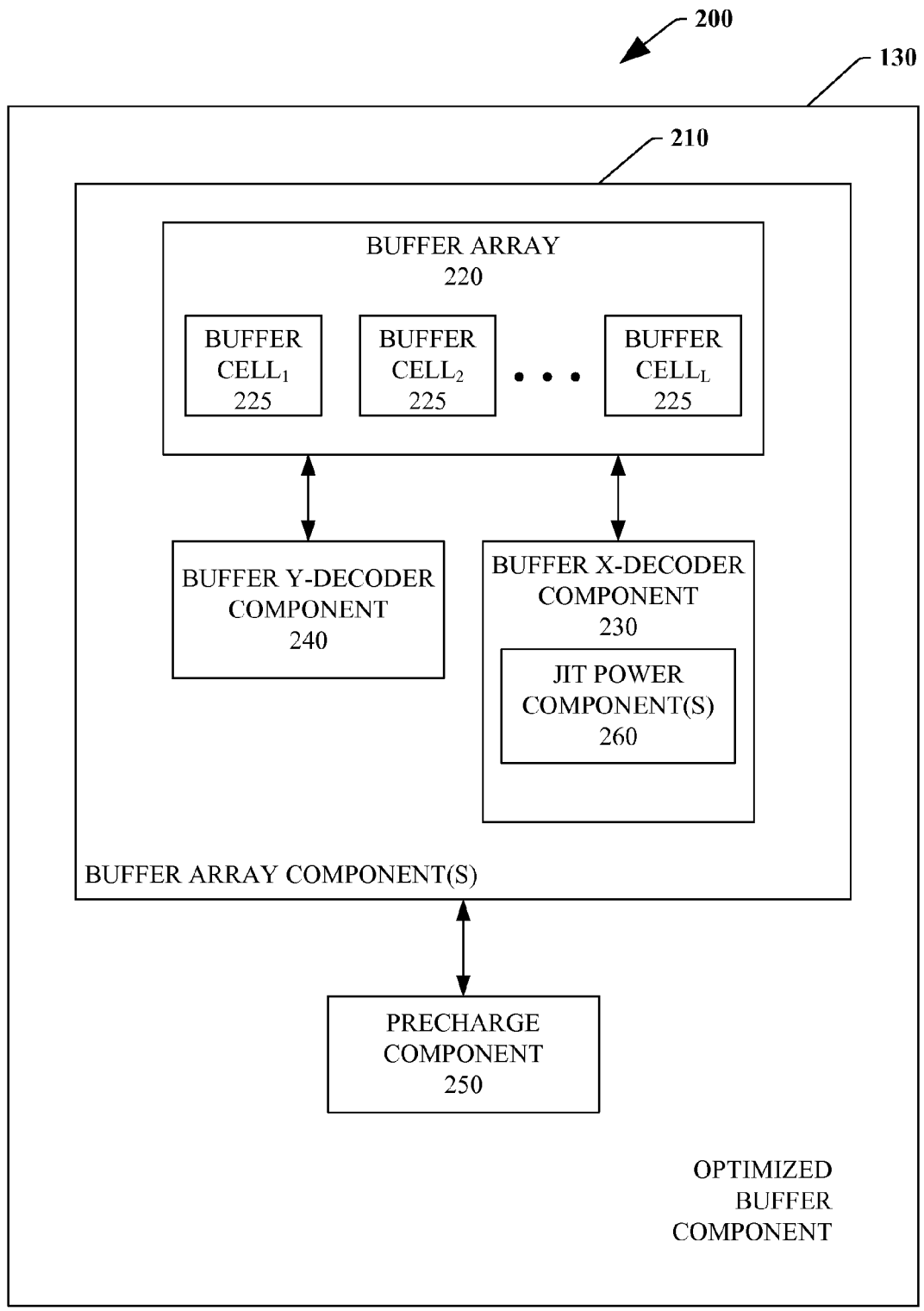
FIG. 2 is a diagram of an optimized buffer system that can facilitate storage and/or access of data associated with a memory in accordance with an aspect of the subject matter disclosed herein.

Referring to FIG. 2, illustrated is an optimized buffer system 200 that can facilitate buffering data associated with a memory in accordance with an aspect of the disclosed subject matter. In one aspect, the system 200 can include an optimized buffer component 130 that can facilitate a reduction in error propagation by facilitating a precharge condition at portions of a buffer array component(s) 210 and/or reducing timing schema complexity and can facilitate reduced power consumption and/or reduced thermal loading with respect to memory operations conducted through the optimized buffer component 130.

In accordance with an aspect of the disclosed subject matter, the buffer array component(s) 210 can comprise a buffer array 220 of volatile memory (e.g., SRAM, DRAM) or non-volatile memory (e.g., as described herein). The buffer array 220 can comprise a plurality of buffer cells 225 (e.g., buffer cell, buffer cell$_2$, and through buffer cell$_L$, as depicted in FIG. 2) which can be arranged in an array format (e.g., same or similar to that shown in FIG. 3) that can facilitate storing and/or accessing data by, for example, storing charge(s) (not illustrated) in the buffer cell 225.

In accordance with another aspect of the subject innovation, a buffer X-decoder component 230 and a buffer Y-decoder component 240 can be communicatively coupled to buffer array 220 to facilitate memory operations with the addressable buffer cells 225. While the buffer X-decoder component 230 and buffer Y-decoder component 240 are illustrated as components of a buffer array component(s) 210, it is to be appreciated that they can be embodied in other components and/or be separate components. In accordance with one aspect, the buffer X-decoder component 230 and buffer Y-decoder component 240 can be tree-type decoders as described herein.

In one aspect, the optimized buffer component 130 can contain a precharge component 250 that can facilitate reducing error propagation. The precharge component 250 can reduce error propagation, for example, by countering parasitic electronic effects (e.g., precharging portions of the optimized buffer array component(s) 210 to a known charge state) and reducing the number of timing signals employed in memory operations (e.g., employing a single PCB signal to effect the precharge condition at portions of the buffer array component(s) 210), or some combination thereof, among others.

In accordance with an aspect of the disclosed subject matter, the precharge component 250 can be communicatively coupled to the buffer array component(s) 210 to facilitate precharging of various portions of the buffer array component(s) 210. Electronic parasitic effects and digital signaling in modern high density electronics can result in errors when accessing data in a buffer memory. As stated herein, parasitic electronic effects can increase as memory devices become more dense. One method of reducing these parasitic effects is to reduce differences in charge levels on signal transmission lines in close proximity.

Precharging a data access line (e.g., a bitline) to a known charge state prior to conducting a memory operation thereon (e.g., reading, writing, updating, erasing, . . . ), can reduce errors in accessing the data thereon (e.g., errors in reading or writing data to/from a buffer cell 225 can be reduced by precharging the bitlines). For example, the precharge component 250 can effect a precharge condition on a data access line (e.g., a bitline) (not shown) related to a buffer cell(s) 225 and can thereby reduce errors when accessing the data in the buffer cell(s) 225 by reducing parasitic electronic effects on the data access line(s) (not shown) of the buffer array component(s) 210. Further, in accordance with one aspect of the disclosed subject matter, a precharge condition can be applied from precharge component(s) 250 to elements of the buffer Y-decoder component 240 to facilitate reducing parasitic electronic effects (e.g., stray capacitance) within the buffer Y-decoder component 240. As stated herein above, precharge conditions can be effected on other portions of the buffer array component(s) 210 as well, for example data access lines (e.g., I/O bitlines) between the buffer Y-decoder 240 and a buffer I/O component (not shown), among others, to reduce errors in memory operations related to parasitic electronic effects.

In accordance with an aspect of the disclosed subject matter, the precharge component 250 can facilitate a reduction in error propagation by reducing timing signal complexity. For example, the precharge component 250 can generate a single precharge control signal (PCB signal) based in part on a timing scheme associated with a memory operation (hereinafter a timing scheme). The precharge component 250 can generate the PCB signal to effect a precharge condition within the buffer array component(s) 210, for example, based in part on monitoring the state of an I/O signal line, a write enable signal line, a read enable signal line, and/or some other signal line related to memory operations of system 200 and/or system 100. By employing, for example, only the single PCB signal, timing schema can be more simple and errors associated with the timing schema can be reduced (e.g., design and implementation of the timing scheme can be easier, testing of the timing scheme can be more thorough, and/or there can be a reduction in errors associated with performing a proper timing scheme across the precharge regions, among others).

As an illustrative non-limiting example, the precharge component 250 can generate a PCB signal which can be applied to effect the precharge condition on a set of nodes of a tree-type buffer Y-decoder component 240 of the buffer array component(s) 210. Further, this same PCB signal can be applied to effect a second (third, fourth, . . . ) precharge condition on, for example, bitlines between the buffer Y-decoder component 240 and the associated buffer cell 225, buffer I/O bitlines lines (not shown), etc. Thus, the single PCB signal generated by the precharge component 250 can effect a plurality of precharge conditions at the same or substantially the same time to facilitate precharging of portions of an optimized buffer component 130 and/or to reduce the complexity of a timing scheme in accordance with aspects of the disclosed subject matter.

Further, the precharge component 250 can receive externally generated PCB signals that can be based in part on the timing scheme, for example, from an external PCB signal generator (not shown), another optimized buffer component 130, other precharge components 250 of system 200, or combinations thereof, among others. For example, a first optimized buffer component 130 can comprise a first precharge component 250 that can generate a first single PCB signal to effect precharging in the first optimized buffer component(s) 210, wherein the first PCB signal additionally can be received (rather than be generated by) a second precharge component 250 within a second optimized buffer component 130 (e.g., in parallel) to effect precharging within the second optimized buffer component 130. It is to be appreciated that, for clarity, only one optimized buffer component 130 is illustrated in FIG. 2; however, the subject innovation is not so limited, as system 200 can contain virtually any desired number of optimized buffer components 130.

In another aspect, a precharge component 250 can reduce error propagation related to complex timing schema by, for example, coordinating timing with other components, such as memory component 110 (e.g., as depicted in FIG. 1 and described herein). For instance, the PCB signal of the first optimized buffer component 130 can be received by (rather than generated by) a second precharge component that can be associated with the memory component 110 to effect precharging on the memory component 110 that is coordinated with the precharging of the buffer array component(s) 210 within the optimized buffer component 130. Therefore, while a PCB signal can be generated and used to effect a precharge condition(s) within a single optimized buffer component 130, it is to be appreciated that a PCB signal can also be used to effect and coordinate precharging of a plurality of portions (e.g., nodes) of system 100 regardless of where in system 100 the PCB is generated (e.g., coordinated second optimized buffer components). This aspect of the subject innovation will not be further elaborated upon to maintain clarity herein where a plurality of levels of coordination between several components and sub-components of system 100 are apparent to one of skill in the art.

The precharge component 250 can effect a precharge condition at portions of a buffer array component(s) 210 in a plurality of ways which can be selected or designed to meet various particular design parameters related to the particular memory system 100 application and will not be extensively elaborated upon herein to prevent obfuscation of the subject innovation. One of skill in the art will appreciate that nearly a limitless number of designs in software, hardware, or combinations thereof, can be employed to effect precharging based in part on a PCB signal without deviating from the scope of the subject innovation. One particular example of the precharge component 250 can comprise a PMOS transistor with a drain attached to a data access line (e.g., a bitline) to be precharged, a source connected to a precharge potential such as Vcc, and a gate connected to the PCB signal generated or received by the precharge component 250 as stated hereinabove. Charge can be conducted through the PMOS from Vcc to the bitline while the PCB signal is disabled (e.g., the PMOS conducts when the gate is in a low state), and therefore can precharge the data access line (e.g., the bitline) to Vcc. Further, when PCB is enabled (e.g., the PMOS gate goes to a high state), the bitline can be isolated from Vcc through the PMOS transistor (e.g., the PMOS does not conduct when the gate is in a high state). The subject innovation contemplates that there can be numerous other substantially equivalent means of effecting the precharge condition employing other types of transistors, filters, components, or semiconductor physics phenomenon that can be substituted for this exemplary PMOS transistor and all are considered to be with the scope of the present innovation.

Further, while the subject innovation is described as employing a single PCB in numerous examples hereinabove and herein below, this is only to illustrate an aspect of the disclosed subject matter and is not intended to be limiting. Employing one or more PCB signals to facilitate precharging while reducing timing scheme complexity is considered within the scope of the subject innovation. For example, where parallel memory operations in different buffer arrays 220 are employed, separate PCB signals may effect precharge conditions on the respective data access lines and signal path elements (not shown) with each of the respective buffer arrays 220 and can result in a simplified timing scheme despite employing multiple PCB signals. In another example, different memory operations (e.g., read and write) may occur in the same buffer array 220 but at separate buffer cells 225 (e.g., a first and second buffer cell), wherein multiple PCB signals may effect precharge conditions on the respective data access lines (e.g., respective bitlines (not shown)) which can result in a simplified timing scheme despite employing multiple PCB signals. These examples illustrate that one or more PCB signals can result in a simplified timing scheme as compared to conventional systems even while employing multiple PCB signals to reduce timing scheme complexity. Numerous other examples will be apparent to one of skill in the art and all are considered within the scope of the subject innovation.

In accordance with another aspect of the disclosed subject matter, the buffer X-decoder component 230 can include a JIT power component(s) 260 that can facilitate reducing and/or minimizing power consumption within the optimized buffer component 130. By employing the JIT power component(s) 260, power can be applied during a buffer operation in a more efficient manner (e.g., "just in time" to power the buffer operation) as disclosed herein.

The JIT power component(s) 260, for example, can enable an access enable line(s) associated with a wordline in the buffer X-decoder component 230 associated with a buffer cell 225 only for the period of time when enablement of the access enable line(s) is germane to the memory operation proceeding (e.g., wordline is enabled only when the memory operation is ready to proceed). In an aspect of the disclosed subject matter, the buffer X-decoder component 230 can enable a wordline (not shown) during a write operation, for example, only when an ADDRESS signal and WRITE ENABLE signal are enabled, such that the wordline can be enabled and can conductively couple the bitline (not shown) to the buffer cell 225 such that the write operation can proceed (e.g., wordline is not enabled before data is loaded from an I/O buffer (not shown), a buffer cell 225 address is decoded in buffer Y-decoder component 240, and/or data is loaded onto the buffer cell bitlines (not shown)). This can reduce the amount of time that the wordline is enabled, similarly reducing the time that the buffer cell 225 associated with the wordline is conductively coupled to the bitlines (not shown) and thereby reducing the time in which power is consumed by passing current between the bitlines and the buffer cell 225, resulting in reduced power consumption. These reductions in power consumption can result in longer battery life, more environmentally friendly systems and/or a reduction in thermal loading (as described hereinabove), among others.

It is to be appreciated and understood that, while the precharge component 250 and JIT power component(s) 260 are depicted in FIG. 2 as being within the optimized buffer component 130, the subject innovation is not so limited, and the precharge component 250 and/or JIT power component(s) 260 can be within the optimized buffer component 130, stand-alone components, or any suitable combination thereof.

While the buffer array component(s) 210 has been discussed in the context of XY-array arrangement of buffer cell(s) 225, one of skill in the art will recognize that other configurations (not shown) of components for addressing buffer cell(s) can be employed that do not require the use of a buffer X-decoder component 230 and/or buffer Y-decoder component 240. These alternate means of addressing a buffer array 220 are considered to be within the scope of the disclosed subject matter and can similarly employ a precharge component 250 and/or employ a JIT power component(s) 260 where germane to memory operations of system 200. Further, other buffer cell arrangements that are not "arrays", and the alternate means of addressing "non-arrayed" buffer cells, are also considered within the scope of the disclosed subject matter. Additionally, while precharging and JIT power control have been described as being employed together herein, it will be appreciated by one of skill in the art that precharging, JIT power control, and/or aspects thereof respectively can be implemented independently within a memory system 100 or optimized buffer component 130 to achieve aspects of the subject innovations herein described.

Figure 3:
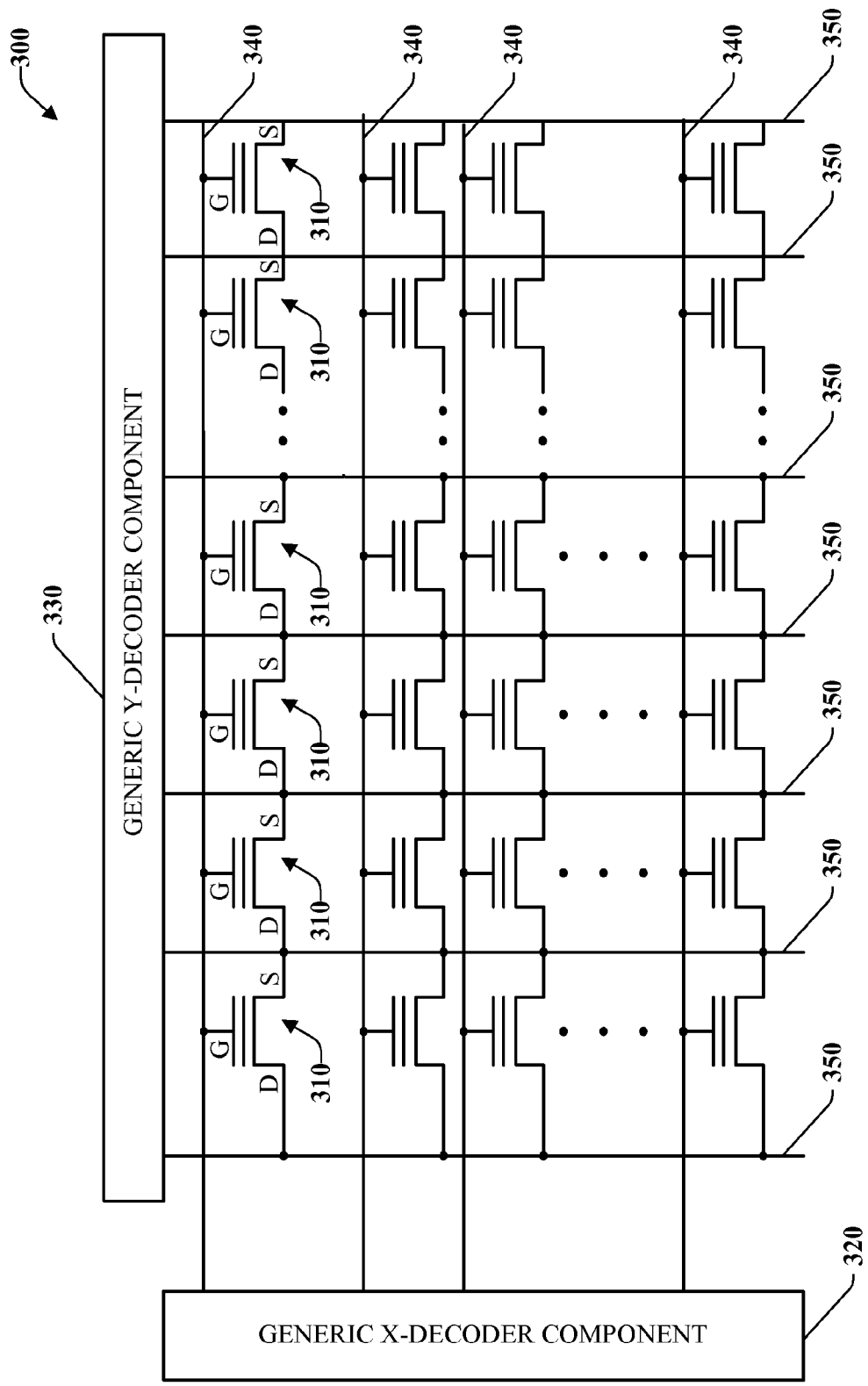
FIG. 3 is a generic schematic diagram of a generic array of memory cells associated with a generic memory in accordance with an aspect of the subject matter disclosed herein.

Turning to FIG. 3, depicted is a schematic diagram of a portion of a generic memory array 300 that can facilitate data storage and/or access in accordance with the disclosed subject matter. The generic memory array 300 can include an array of generic memory cells 310 (e.g., adapted to core cells, adapted to buffer cells, . . . ) that can comprise a plurality of transistors. While only a single transistor is illustrated as representative of a generic memory cell 310, the generic memory cell can comprise a plurality of transistors for each cell, for example, a six transistor SRAM cell, among others. Transistors in a generic memory 310 cell can each be comprised of a drain (D), gate (G), and source (S) and be interconnected as is well known in the art to produce an appropriate type of memory cell for the application selected. In accordance with an aspect, one or more bits of data can be stored in each generic memory cell 310. In accordance with another aspect, each generic memory cell 310 can be a multi-level cell, where data can be represented by a level of charge stored within the memory cell 310.

The generic memory array 300 can include a generic X-decoder component 320 (e.g., word line decoder) and a generic Y-decoder component 330 (e.g., bitline decoder) that can each respectively decode inputs/outputs during various memory operations (e.g., writing, reading, refreshing, erasing, . . . ) that can be performed on the generic memory cells 310, to facilitate storage and/or access of data. The generic X-decoder component 320 and generic Y-decoder component 330 can each receive address bus information, for example, from a host processor (not shown) and/or system controller (not shown), or the like, and can utilize such information to facilitate accessing or selecting generic memory cell(s) 310 (e.g., memory location(s)) associated with the memory operation. The generic memory array 300 can be adapted to facilitate a broad plurality of memory applications. For example, where generic memory component 300 is adapted to an optimized buffer component 130, generic X-decoder 320 can be or can contain the same or similar functionality as a buffer X-decoder component 230 (as depicted in FIG. 2 and described herein), generic Y-decoder 330 can be or can contain the same or similar functionality as a buffer Y-decoder component 240 (as depicted in FIG. 2 and described herein), and generic memory cells 310 can be or can contain the same or similar functionality as buffer cells 225 (as depicted in FIG. 2 and described herein). In another example, where generic memory component 300 is adapted to a core component 120 (as depicted in FIG. 1 and described herein), the generic X-decoder 320 can be adapted to be a core X-decoder (not shown), the generic Y-decoder 330 can be adapted to be a core Y-decoder (not shown), and the generic memory cells 310 can be adapted to be core cells (not shown). In accordance with one aspect, the generic X-decoder 320 and generic Y-decoder 330 each can be tree-type decoders.

The generic memory cells 310 can be formed in rows and columns. A common wordline 340 can be, for example, commonly coupled to the control gate (G) of each memory cell 310 in a row to control when the generic memory cells 310 in that row can be conductively coupled to the bitline columns as is well known in the art. Further, for example, a common bitline 350 can be commonly coupled to each generic memory cell 310 in a column and can be selectively conductively coupled to the generic memory cell 310 by the common wordline 340 as is well known in the art. Further, each common bitline 350 can also comprise a plurality of data access lines (e.g., bitline and bitlinebar for memory operations on a SRAM type memory cell, among others). In accordance with an aspect of the disclosed subject matter, respective charge potentials can be applied to one or more memory cells 310 through the common wordlines 340 and common bitlines 350 to facilitate performing memory operations, such as write, read, refresh, erase, and the like.

It is to be appreciated that while the generic memory cells 310 are shown as being respectively associated with a drain and a source, in accordance with one embodiment, where a generic memory cell 310 contains charge storage components on two sides of the generic memory cell 310 that can each be programmed with data (e.g., charge stored therein), the drain can act as the source, and/or the source can act as the drain, depending on which charge storage component of the generic memory cell 310 is being charged during a given memory operation.

Figure 4:
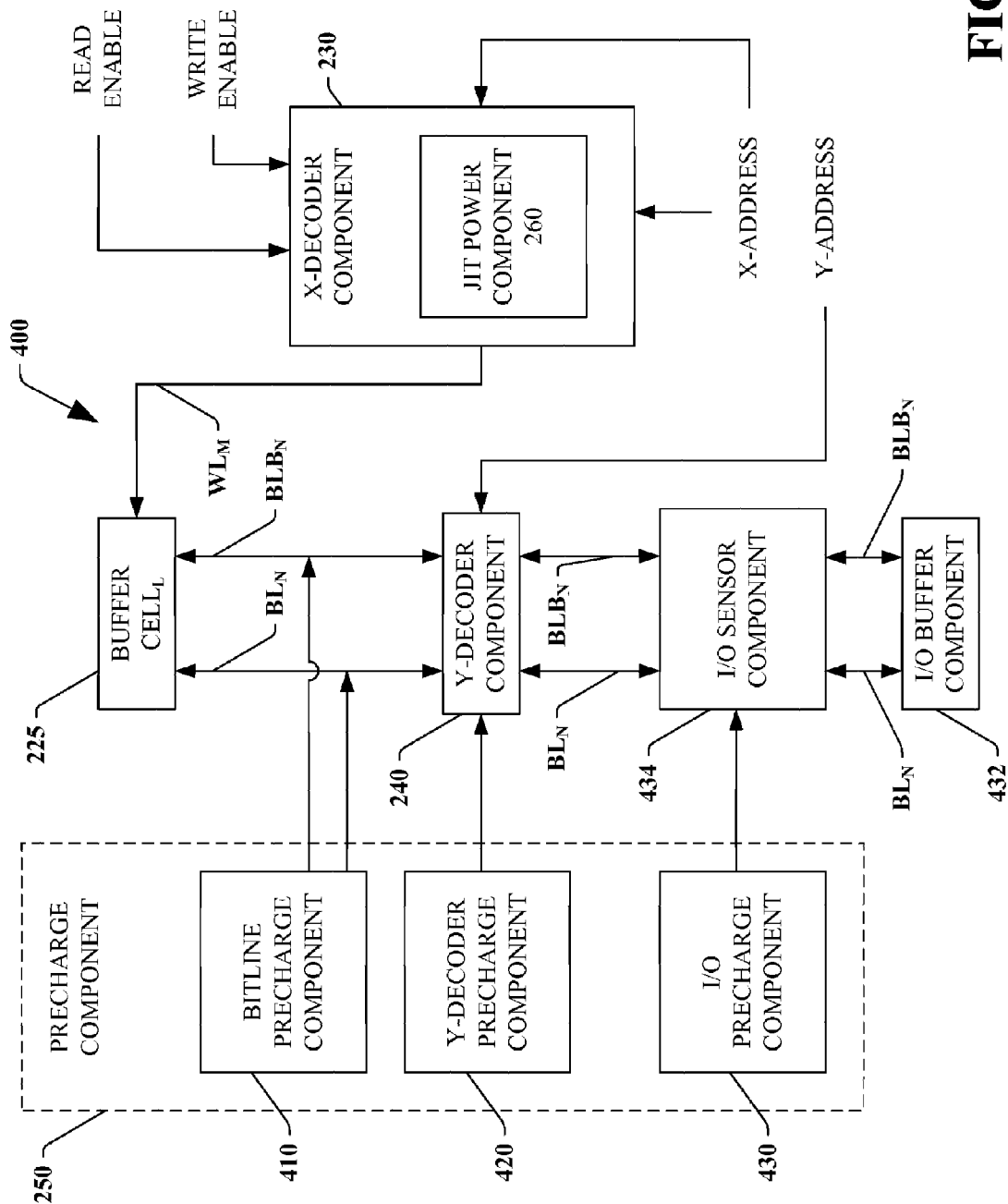
FIG. 4 illustrates a block diagram of a system that can facilitate access and/or storage of data associated with a buffer component in a memory in accordance with an aspect of the disclosed subject matter.

Turning to FIG. 4, depicted is a block diagram of a system 400 that can facilitate access and/or storage of data associated with an optimized buffer component associated with a memory component 110 in accordance with the disclosed subject matter. A buffer cell 225 (e.g., buffer cell$_1$ 225, buffer cell$_2$ 225, can be, for example, communicatively coupled to a buffer X-decoder component 230 by access enable line WL_M and a buffer Y-decoder component 240 by data access lines BL_N and BLB_N. Access enable line WL_M can be a wordline. Data access line BL_N can be a bitline and data access line BLB_N can be a bitlinebar where buffer cell 225 is an SRAM for example (e.g., BL_N and BLB_N can be data access lines). Where other types of memory are used for the buffer cell 225, BL_N. BLB_N, and WL_M can represent the appropriate data access or data enable lines to perform memory operations (e.g., write, read, refresh, erase, . . . ) with the buffer cell 225.

In accordance with the disclosed subject matter, for example, a single PCB signal can be generated and/or received by a precharge component 250 and be communicated to, for example, precharge sub-components (e.g., bitline precharge component 410, buffer Y-decoder precharge component 420, and/or I/O precharge component 430, among others) to facilitate generating a precharge condition on, for example, a bitline (e.g., BL_N and BLB_N), a buffer Y-decoder component 240, and/or a buffer I/O data access line (e.g., BL_N and BLB_N between a buffer I/O component and a buffer Y-decoder component 240), among others, related to performing a memory operation (e.g., read write, refresh, erase, . . . ). For example, bitline precharge component 410 can effect a precharge condition on BL_N and BLB_N, buffer Y-decoder precharge component 420 can effect a precharge condition on the data access lines through the buffer Y-decoder component 240, and/or I/O precharge component 430 can effect a precharge condition on the data access lines through the buffer I/O sensor component 434 such that the data access lines (e.g., related conductors that pass data between an addressed buffer cell 225 and an I/O component 432) can be in a known condition prior to data being placed on the data access lines during a memory operation (e.g., read, write, refresh, erase, . . . ). In this particular example, use of a single PCB signal passed substantially at the same time to the three exemplary precharge sub-components (e.g., bitline precharge component 410, Y-decoder precharge component 420, and I/O precharge component 430) to effect the precharge condition at the three relative portions of the data signal path between the I/O buffer component 432 and the buffer cell 225 can simplify management of timing signals by reducing the complexity of a timing scheme. Further, in this particular example, precharging the data signal path between the I/O buffer component 432 and the buffer cell can reduce error propagation resulting from undefined conditions on the data signal path prior to the memory operation because error propagation from parasitic electronic effects can be reduced by precharging the data signal path as hereinabove described.

Precharge component 250 is shown with a dotted outline to emphasize that the precharge component 250 can be considered logically comprised of a group of one or more precharge sub-components (e.g., bitline precharge component 410, buffer Y-decoder precharge component 420, and/or I/O precharge component 430, among others). Moreover, the precharge sub-components (e.g., bitline precharge component 410, buffer Y-decoder precharge component 420, and/or I/O precharge component 430, among others) can be located in a close proximity to each other or can be spatially distributed, for example, such that each precharge sub-component (e.g., bitline precharge component 410, buffer Y-decoder precharge component 420, and/or I/O precharge component 430, among others) can be located in closer proximity to the data access line that they effect the precharge condition on, to facilitate higher density memory layouts. One of skill in the art will appreciate that location and layout of the sub-components (e.g., bitline precharge component 410, buffer Y-decoder precharge component 420, and/or I/O precharge component 430, among others) of the precharge component 250 can be logically related without necessarily being physically grouped together and, for example, that a generated and/or received single PCB signal can be shared between the sub-components (e.g., bitline precharge component 410, buffer Y-decoder precharge component 420, and/or I/O precharge component 430, among others) at substantially the same time to effect the separate precharge conditions relative to each sub-component (e.g., bitline precharge component 410, buffer Y-decoder precharge component 420, and/or I/O precharge component 430, among others) receiving the PCB signal.

In accordance with another aspect, selection of a desired buffer cell 225 can be facilitated by decoding a buffer X-ADDRESS and a buffer Y-ADDRESS in the buffer X-decoder component 230 and the buffer Y-decoder component 240, respectively, in a manner facilitating reduced power consumption and reduced thermal loading. In another aspect, one or more signals related to timing of a buffer memory operation (e.g., an address, a read enable and a write enable signal, among others) can be passed to a JIT power component 260 within the X-decoder component 230 such that, for example, an access enable line (e.g., WL_M) can be enabled "just in time" through buffer X-decoder 230 to facilitate enabling access to the buffer cell 225 only for the period of time desired to access the buffer cell 225 in order to reduce the amount of power consumption associated with performing a memory operation. This can result, for example, in conductively coupling BUFFER CELL_L 225 to BL_N and BLB_N (e.g., WL_M can turn on the gate transistors between BUFFER_CELL_L and BL_N and BLB_N) only when desired to proceed with a memory operation, reducing the temporal window in which current flows to/from BL_N and/or BLB_N through BUFFER_CELL_L 225. The use of the JIT power component(s) 260 can therefore, for example, limit enabling WL_M until just when WL_M is desired to execute a memory operation and thereby reduce power consumption and reduce thermal loading.

For example, during a write operation, the JIT power component 260 can enable an access enable line (e.g., WL_M) associated with buffer cell 225 only when the JIT power component 260 receives the address signal and write enable signal associated with buffer cell 225, where the length of time that the address signal and/or write enable signal is provided to the JIT power component 260 can be structured so that the access to the buffer cell 225 can be for a length of time desired to access the buffer cell 225 and program the data into the buffer cell 225. As another example, during a read operation, the JIT power component 260 can enable an access enable line associated with buffer cell 225 only when the JIT power component 260 receives the address signal and read enable signal associated with buffer cell 225, where the length of time that the address signal and/or read enable signal is provided to the JIT power component 260 can be structured so that the access to the buffer cell 225 can be for a length of time desired to access the buffer cell 225 and read the data from the buffer cell 225.

Figure 5:
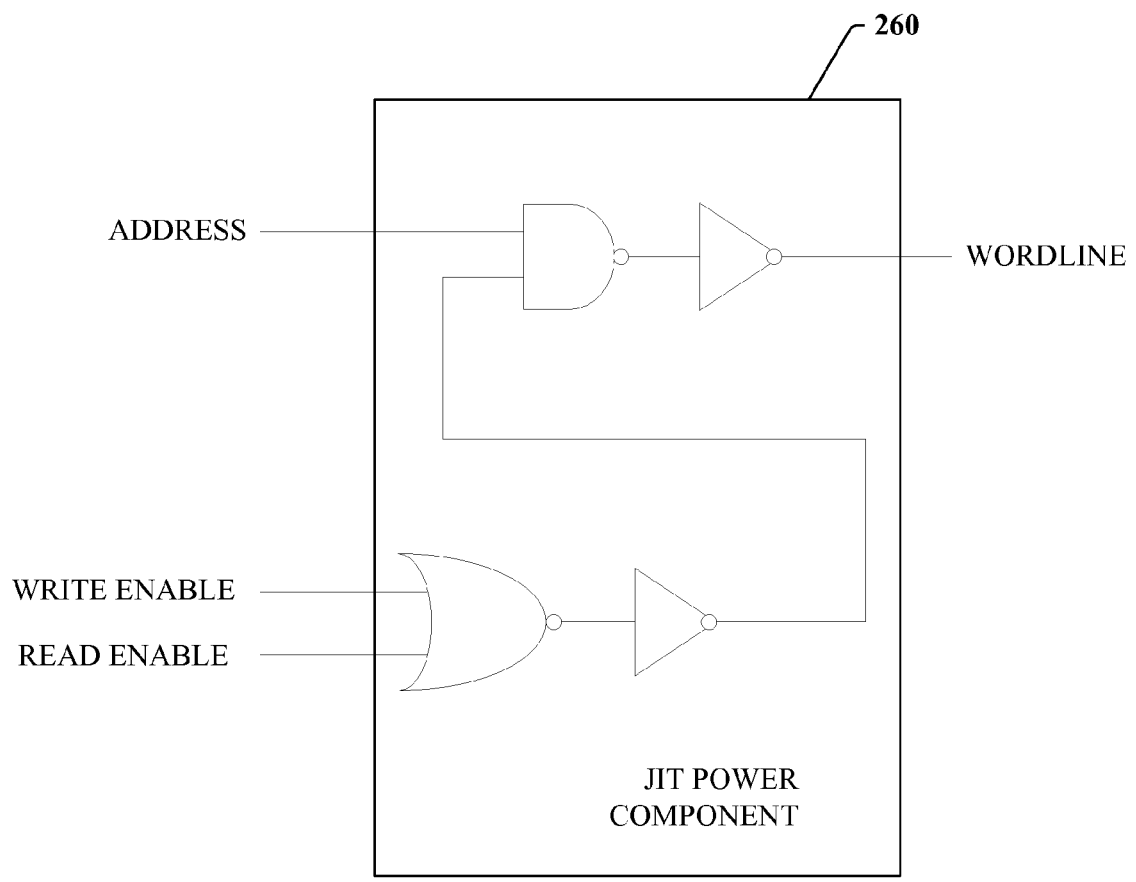
FIG. 5 depicts an exemplary logic diagram of a JIT power component in accordance with an aspect of the disclosed subject matter.

FIG. 5 depicts a logic diagram of an exemplary JIT power component 260 in accordance with an aspect of the disclosed subject matter to facilitate reduced power consumption and reduced thermal loading. In one aspect, the JIT power component 260 can be the same or similar as, and/or can contain the same or similar functionality as, the JIT power component 260 as described herein, for example, with regard to system 200 and/or system 400. The exemplary logic design shown in FIG. 5 illustrates that WORDLINE is enabled only when the desired components of the memory operation are present at the input to the logic circuit (e.g., when ADDRESS plus WRITE ENABLE and/or READ ENABLE are enabled). This can facilitate "just in time" power management, for example, during a memory operation (e.g., read, write, refresh, erase, . . . ) to reduce overall power consumption and/or reduce thermal loading in increasingly dense computer memory products in accordance with the disclosed subject matter.

This particular exemplary logic design is presented only as one example of a logic circuit associated with a JIT power component 260 and is not intended to limit the scope of the disclosed subject matter. More particularly, this specific example illustrates (please see Table 1) that a NOR gate can be used in conjunction with a NOT gate to pass a high signal to one input of a NAND gate when either WRITE ENABLE (WE) and/or READ ENABLE (RE) are high and pass a low state when both WE and RE are at low. Correspondingly, the NAND gate can pass a low signal to a second NOT gate when ADDRESS is high simultaneous with either WE and/or RE. The second NOT gate can then produce a high WORDLINE signal only when there is both a high ADDRESS and either a high WE and/or RE. This logic is summarized in the truth table shown as Table 1 below. By limiting enablement of WORDLINE to periods when there is both an addressed memory cell (e.g., ADDRESS is enabled) and a write enable or read enable signal present (e.g., WE and/or RE are enabled), the length of time that the buffer cell (e.g., buffer cell 225 as illustrated in FIGS. 2 and 4, and described herein) is accessed is similarly limited, which can thereby reduce power consumption and thermal loading associated with operations in a memory system (e.g., system 100, system 200, system 400 . . . ).

TABLE 1

Possible logic states for a JIT power component 260 as illustrated in FIG. 5.

| Variable/State | 0 | 1 | 2 | 3 | 4 | 5 | 6 | 7 |
|---|---|---|---|---|---|---|---|---|
| ADDRESS | 0 | 1 | 0 | 1 | 0 | 1 | 0 | 1 |
| WRITE ENABLE | 0 | 0 | 1 | 1 | 0 | 0 | 1 | 1 |
| READ ENABLE | 0 | 0 | 0 | 0 | 1 | 1 | 1 | 1 |
| WE NOR RE | 1 | 1 | 0 | 0 | 0 | 0 | 0 | 0 |
| !(WE NOR RE) | 0 | 0 | 1 | 1 | 1 | 1 | 1 | 1 |
| ADDRESS NAND (!WE NOR RE) | 1 | 1 | 1 | 0 | 1 | 0 | 1 | 0 |
| WORDLINE = !(ADDRESS NAND (!WE NOR RE)) | 0 | 0 | 0 | 1 | 0 | 1 | 0 | 1 |

One of skill in the art will appreciate that numerous other logic designs and circuits can be employed to effect JIT power conservation and/or reduced thermal loading throughout a system (e.g., system 100 or system 200), an optimized buffer component 130, a memory component 110, or combinations thereof, among others.

The aforementioned systems have been described with respect to interaction between several components. It should be appreciated that such systems and components can include those components or sub-components specified therein, only some of the specified components or sub-components, and/or additional components. Sub-components can also be implemented as components communicatively coupled to other components rather than included within parent components. Further yet, one or more components and/or sub-components can be combined into a single component providing aggregate functionality. The components can also interact with one or more other components not specifically described herein for the sake of brevity, but known by those of skill in the art.

FIGS. 6-11 illustrate methodologies, flow diagrams, and/or timing diagrams in accordance with the disclosed subject matter. It is to be appreciated that the methodologies presented herein can incorporate actions pertaining to a neural network, an expert system, a fuzzy logic system, and/or a data fusion component, or a combination of these, which can generate diagnostics indicative of the optimization of memory operations germane to the disclosed methodologies. Further, the prognostic analysis of this data can serve to, for example, adjust timing schema to better optimize memory operations, and can be based on real time acquired data or historical data or error propagation within a methodology or from components related to a methodology herein disclosed, among others. Applying this advanced data analysis in the system or device can reduce error propagation resulting from perturbed timing schema and/or perturbed data access, improve power conservation and reduce thermal loading, among others, and improve memory system methodology performance over time. It is to be appreciated that the subject invention can employ highly sophisticated diagnostic and prognostic data gathering, generation and analysis techniques, and such should not be confused with trivial techniques such as automatic shutdown based on an excessively high current or temperature.

For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

Figure 6:
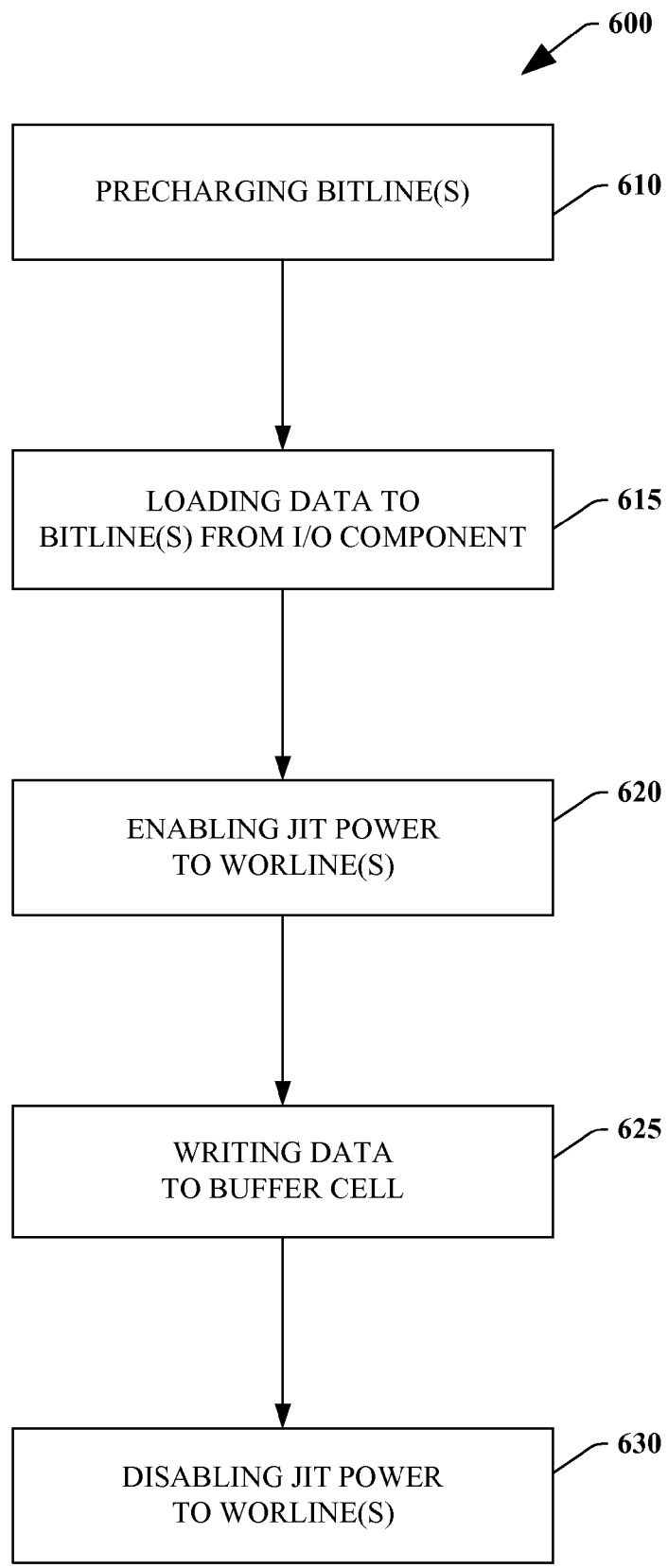
FIG. 6 illustrates a methodology that facilitates a write operation in accordance with an aspect of the disclosed subject matter.

Referring to FIG. 6, illustrated is a methodology 600 that can write buffer data to facilitate accessing data associated with a memory component (e.g., 110) in accordance with the disclosed subject matter. The write operation methodology can facilitate writing data to a buffer cell while reducing error propagation associated with parasitic electronic effects and reducing errors associated with complex timing schema. The methodology 600 can reduce error propagation by precharging one or more data signal paths (e.g., bitlines, buffer Y-decoder signal paths, and/or buffer I/O signal paths, among others). Further, the method 600 can reduce errors propagation by simplifying timing schemes by effecting the one or more precharge conditions based at least in part on a single PCB signal. The following methodology is not meant to be limiting and is merely representative of numerous possible configurations of a methodology that is in accord with the subject innovation herein described.

In accordance with one aspect, at 610, one or more precharge conditions can be generated in response to a single precharge control signal (PCB). In one aspect, a precharge component (e.g., 250) can generate (and/or receive as herein described) one or more PCB signals to facilitate reducing errors associated with complex timing schema. For example, one PCB signal can simultaneously or substantially simultaneously effect precharge conditions on, for example, a data access line (e.g., a bitline(s)), a buffer Y-decoder component (e.g., 240), and/or a buffer I/O data access line, among others (e.g., the PCB effects precharge conditions from bitline precharge component 410, Y-decoder precharge component 420, and/or I/O precharge component 430 to the respective portions of the data signal path), to facilitate reducing errors associated with parasitic electronic effects when executing a memory operation (e.g., read, write, refresh, erase, . . . ). This can, for example, result in reducing error propagation resulting from, for example, unforeseen timing glitches, lag time in signal triggering due to backlogging of timed signals, and/or errors in programming a state machine or method where the complexity of the temporal signal bundle can cause confusion, among others.

In accordance with an aspect, at a predetermined interval after the precharge condition has been effected (e.g., sufficient time for the bitlines to come to a steady or nearly steady state at precharge levels, among others), the PCB signal can be switched to a "high" signal such that the precharge action is completed. By completing the precharging action, the data access line (e.g., bitline, among others) can be isolated from the precharge component, for example, by opening a gate transistor, among others. A data access line (e.g., a bitline) isolated from a precharge component can remain in the precharged state (e.g., the bitline can "float" at the precharge condition such that a bitline precharged to, for example, Vcc will remain at Vcc when isolated from the precharge component in the absence of intervening effects, for example, a resistive path to ground, among others.) Where, for example, the bitlines are floating, they can gradually decay to an unknown state due to parasitic electronic effects (e.g., cross talk with other signals, parasitic high impedance ground paths . . . ). Thus it can be desirable to begin loading data within a time frame that allows for minimal decay of the precharged condition of the bitlines after the precharging action has been completed.

At 615, data can be loaded to the bitline(s) from, for example, the I/O component. Conventionally, parasitic electronic effects (e.g., stray capacitance, . . . ) can cause a significant risk of error propagation (e.g., cross talk, among others) where data is loaded onto bitlines in an unknown initial state, which can, for example, result in inversion of transistor conditions that can damage the transistors, cause them to lock in a particular state, or turn on or off in an undesired manner. By placing the bitlines in a known condition prior to placing data on them, errors associated with unknown initial states can be mitigated. In one aspect, data can be loaded onto the precharged bitlines from a data source, such as, for example, an I/O component. Where, for example, loading the data onto the bitlines occurs soon after the precharged data lines have been isolated from the precharge component (as herein above discussed), the precharged bitline(s) can be at or near the known initial state and data can be loaded onto the lines to facilitate a reduction in error propagation.

At 620, a wordline(s) can be enabled based in part on a JIT enable signal. In one aspect, a wordline(s) associated with a buffer cell in the optimized buffer component can be enabled upon receiving an access enable signal from the JIT power component to facilitate accessing the buffer cell to perform an operation thereon. In accordance with an aspect, connecting a buffer cell 225 to data access lines (e.g., bitlines) can occur to facilitate reduced power consumption and reduced thermal loading. Conventionally, excess power can be consumed by having data access lines (e.g., bitlines) conductively coupled to a memory cell as a result of enabling a access enable line (e.g., wordline) when a memory operation is not in a condition to proceed. By enabling, for example, a wordline only when the memory operation (e.g., read, write, refresh, erase, . . . ) is in a condition to proceed, power consumption can be reduced. For example, an enable signal can be provided on an access enable line (e.g., a wordline(s)) based at least in part on timing conditions associated with memory operations (e.g., read, write, refresh, erase, . . . ) such that wordline is enabled and the buffer cell is conductively coupled to the bitlines only when the write operation is ready to proceed. This can result in power conservation and reduced power consumption can result in reduced thermal loading.

At reference numeral 625, data can be written, for example, to the buffer cell. For example, the bitlines can be coupled to an addressed buffer cell though gate transistors that can be enabled by a wordline signal generated, for example, by a JIT power component. The data can be transferred from the bitlines into the buffer cell associated with the respective bitline and/or wordline.

At 630, the wordline(s) can be disabled. In one aspect, after the data has been written to the buffer cell, the wordline associated with the buffer cell can be disabled. The predetermined voltage associated with the access enable line (e.g., wordline) can be discontinued or disabled "just in time", to further facilitate reducing energy consumption. For example, where timing signals such as ADDRESS and/or WRITE ENABLE (among others) switch to disable (e.g., a digital low state), the JIT power component 260 can propagate a WORDLINE disable (e.g., a digital low state) at an earlier time than in a conventional memory operation. This can result, for example, in isolating the buffer cell from the bitlines (e.g., opening the buffer cell gate transistors, by disabling wordline, and disabling the conductive coupling between the buffer cell and the bitlines) after the data has been written or transferred into the buffer cell associated with the wordline and bitlines in the buffer array. By disabling the access enable line (e.g., wordline) "just in time" after the data is written, power can be conserved by no longer having current passing between the bitlines and the buffer cell. This can also reduce thermal loading.

Conventionally, where a methodology associated with a write operation is executed, excess power over time can be expended between a buffer cell and bitlines as a result of non-optimal wordline control of the buffer cell gate transistors. In high density memory products this can lead to, for example, excessive battery drain, failure to meet environmental power consumption standards, or increased thermal loading, and combinations thereof among others. Thus, optimizing temporal control of wordlines by employing a JIT (just in time) enabling and disabling of such wordlines can improve efficiency and reduce thermal loading. At this point, methodology 600 can end.

Figure 7:
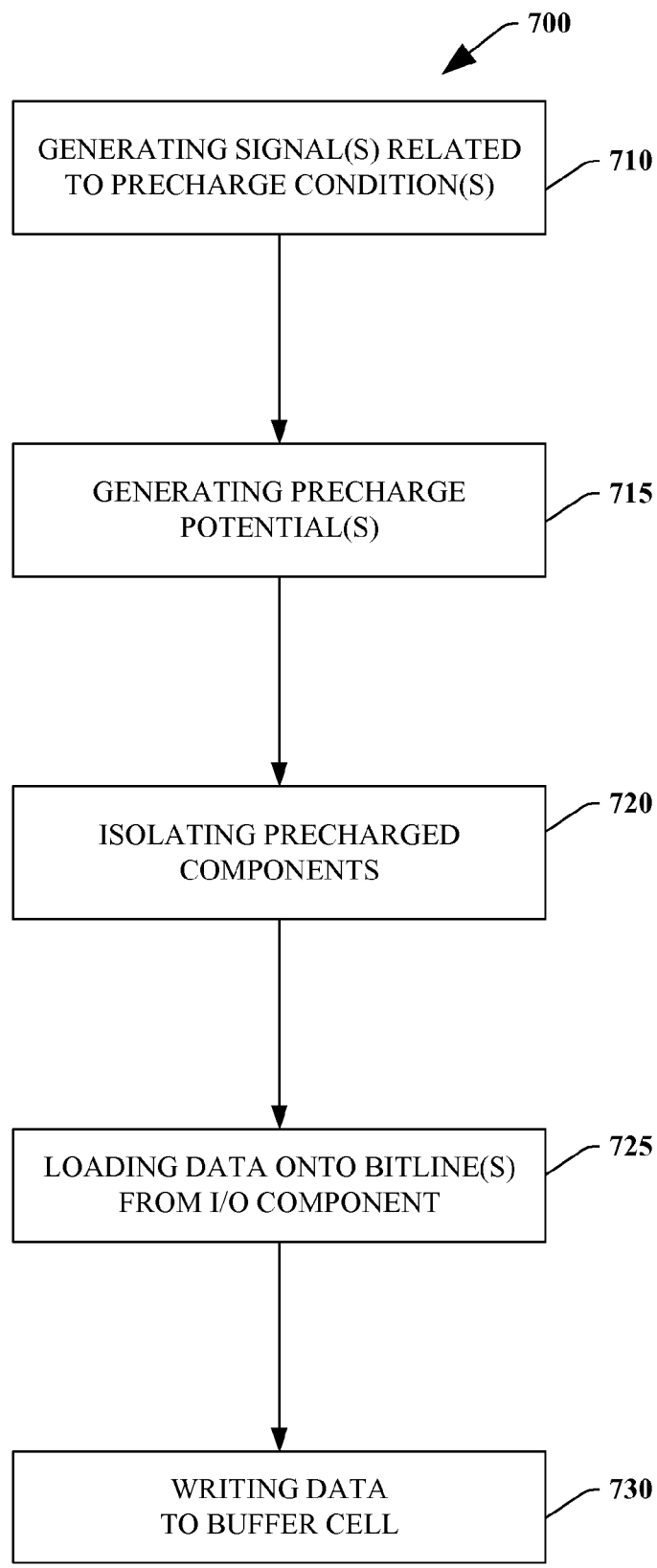
FIG. 7 illustrates another methodology that facilitates a write operation in accordance with an aspect of the disclosed subject matter.

Referring to FIG. 7, another exemplary write methodology 700, in accordance with the disclosed subject matter, is illustrated that can facilitate reducing error propagation associated with parasitic electronic effects. At reference numeral 710, a PCB signal can be generated. For example, a single PCB signal based in part on a memory operation condition can be generated to facilitate effecting respective precharge conditions on bitlines, a buffer Y-decoder component, and/or a buffer I/O lines by precharge subcomponents (e.g., bitline precharge component 410, Y-decoder precharge component 420, and/or I/O precharge component 430). At reference numeral 715, respective precharge voltage potentials can be generated and applied to effect respective precharge conditions based in part on the PCB signal. In one aspect, respective precharge voltage potentials can be generated respectively by the bitline precharge component 410, Y-decoder precharge component 420, and/or I/O precharge component 430 and can be applied to the bitline(s) associated with the buffer memory cell(s), the Y-decoder component, and/or the I/O lines associated with the buffer cell, respectively, based in part on the PCB signal. Effecting these several precharge conditions from, for example, a single PCB signal can reduce error propagation related to complex timing schema as described herein. The precharge condition can facilitate a reduction in error propagation resulting from parasitic electronic effects by generating a known initial state as herein above discussed.

At 720, the precharge control signal (e.g., PCB) can be switched off (e.g., switched to a "high" signal). In one aspect, when the respective nodes and/or components, such as bitline(s) associated with the buffer cell, the Y-decoder component, and/or I/O lines associated with the buffer cell are precharged to their respective precharge conditions, the precharge control signal (PCB) can be switched off, which can facilitate isolating the precharged data access lines (e.g., bitlines, . . . ) leaving them floating at a precharged state. This precharge state can decay over time due to parasitic electronic effects as herein described. Thus, it can be desirable to load data onto, for example, the bitlines, before significant decay of the precharged state of the data access lines (e.g., bitlines) has occurred. At 725, data can be loaded onto the bitlines from, for example, a buffer I/O component. At 730, the data can be written to, for example, the buffer cell associated with the bitlines. At this point, methodology 700 can end.

Figure 8:
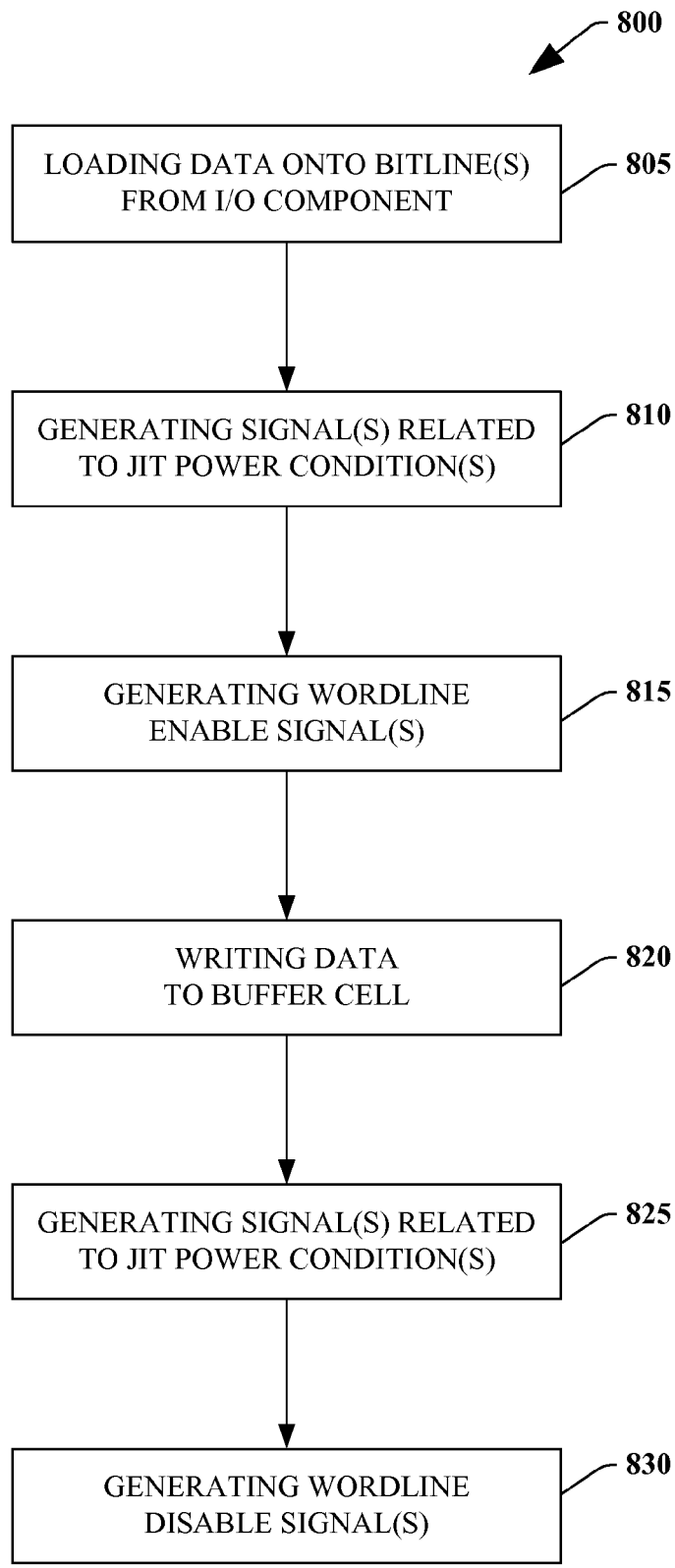
FIG. 8 illustrates another methodology that facilitates a write operation in accordance with an aspect of the disclosed subject matter.

Referring to FIG. 8, illustrated is a methodology 800 that can facilitate reduction in power consumption associated with operations in a memory, in accordance with an aspect of the disclosed subject matter. At 805, loading data onto the bitlines can occur, for example, from an I/O component. In one aspect, data can be loaded onto data access lines (e.g., bitlines) to facilitate, for example, writing data to a buffer cell. At reference numeral 810, a signal related to the JIT power condition can be generated (e.g., where ADDRESS and WRITE ENABLE are high, a WORDLINE enable can be generated). The WORDLINE condition (e.g., enabled or disabled) can be generated by, for example, a JIT power component 260. At reference numeral 815, an access enable line (e.g., wordline) can be enabled based in part on the signal related to the JIT power condition. For example, as the wordline is enabled, the gate transistors on a buffer cell can be turned on conductively coupling the buffer cell to data access lines (e.g., bitlines) having the data on them. At 820, data can be written to the buffer cell, as a result of conductively coupling the buffer cell to the bitlines.

At reference numeral 825, a signal indicating that the write can end can be generated and passed, for example, to a JIT power component. Such signal can be in response to, for example, successfully writing data into the buffer cell from the bitlines. At 830, the signal indicating the write can end can facilitate causing the wordline associated with the buffer cell to become disabled. Disabling the wordline can cause the buffer cell gate transistors to shut off and can isolate the buffer cell, which can now contain the newly written data. Thus, methodology 800 can facilitate reducing power consumption associated with operations on buffer cells in the optimized buffer component in part by reducing the length of time that the wordline(s) associated with the buffer cell(s) is enabled during an operation to a period of time where access to the buffer cell(s) is desired to execute the operation (e.g., write data to buffer cell, read data from buffer cell, erase data from buffer cell, . . . ). At this point, methodology 800 can end.

Figure 9:
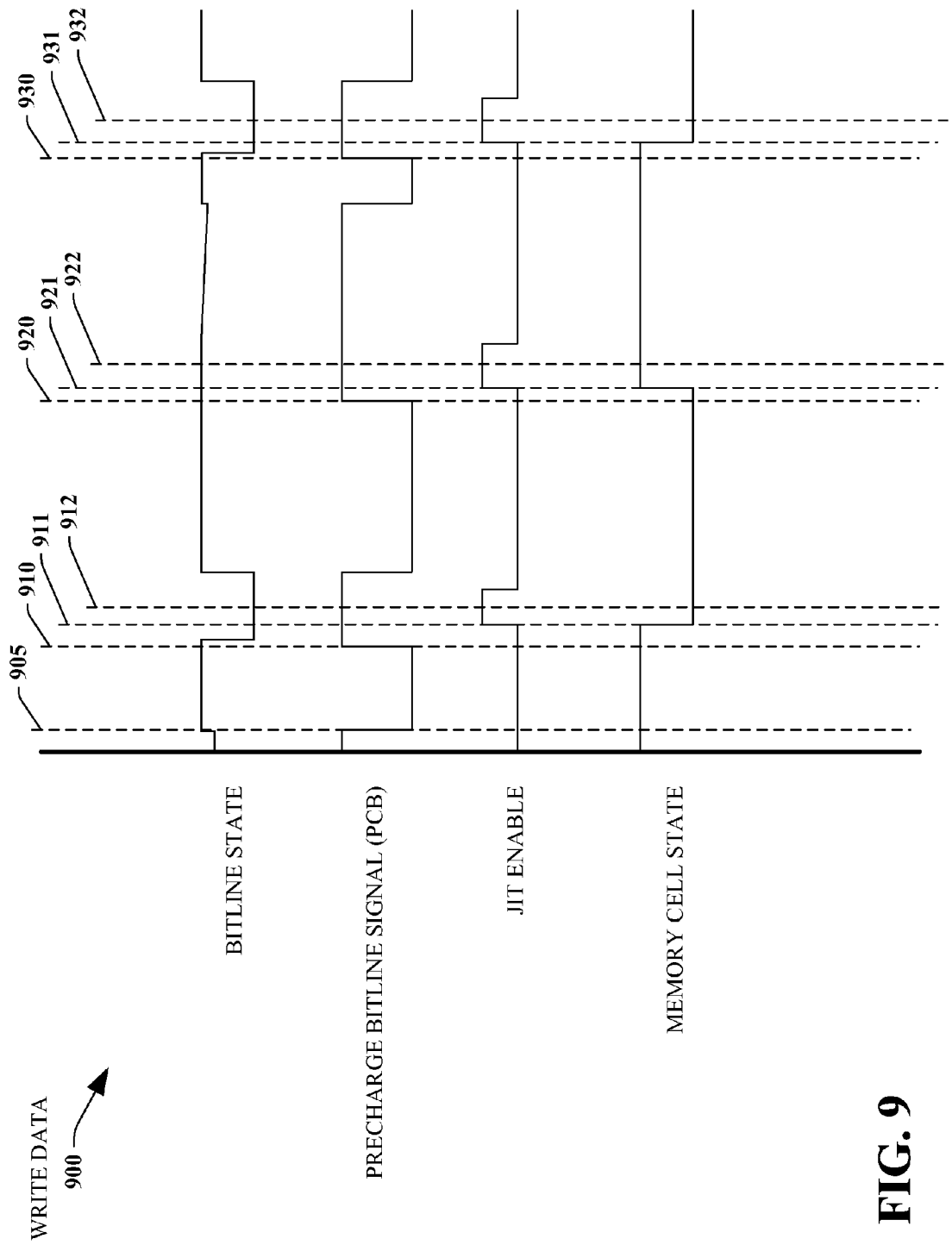
FIG. 9 depicts an exemplary timing diagram that illustrates aspects of a write operation in accordance with an aspect of the disclosed subject matter.

FIG. 9 depicts a timing diagram 900 to help illustrate aspects of timing a write operation method, for example, the methodology 600 (e.g., as illustrated in FIG. 6), in accordance with at least one aspect of the disclosed subject matter. The discussion of timing diagram 900 is given entirely as an example wherein a bitline precharge component 410 can be defined for purposes of this exemplary timing diagram as a simple PMOS gate as described herein. When the PCB signal is low the bitline precharge component 410 can be precharging and when PCB signal is high the bitline precharge component 410 can be not precharging (e.g., the PMOS is disabled when the gate potential is a digital "high") and can isolate the bitline precharge component 410 from the data access lines (e.g., bitlines). This example is not intended to be limiting and is only given to provide a clear and easily understandable illustration of the subject innovation.

Continuing with the example, the access data line state (e.g., bitline state) can be undefined as illustrated before reference numeral 905 because the PCB signal is high and the bitline is isolated from the bitline precharge component 410 through the PMOS as described herein. Further, before the time associated with 905, a JIT power component 260 can be generating and/or providing a wordline disable signal (e.g., JIT ENABLE is low) because power to the wordline is not desired during such period of time associated with the memory operation as described herein (e.g., WRITE ENABLE and ADDRESS signal conditions effect a WORDLINE disable signal from the JIT power component 260). At reference numeral 905, the bitline precharge component 410 can generate (or receive) a "low" PCB signal causing a precharge condition on the bitline by turning on the exemplary PMOS in accord with this particular example of the disclosed subject matter. Therefore, at 905, the bitline can rise to a defined precharge state (e.g., Vcc), which can facilitate reducing errors associated with writing data to a bitline that is in an undefined state. The currently disabled state of the wordline can keep the memory cell (e.g., a buffer cell) disconnected from the bitlines. The isolated memory cell can therefore maintain its current value(s) and can be insensitive to changes in the bitline state.

At 910, the precharge condition can be turned off (e.g., PCB goes high) causing the bitline to become isolated from the precharge component and enter a floating state as described herein. In this floating state (e.g., after the time associated with reference numeral 910), the charge condition applied to the bitline between the time at 905 and the time at 910 can remain but can be subject to parasitic electronic effects which over time can cause the bitline state to drift into an undefined state (not illustrated). Therefore, during the time period between 910 and 911 data can be loaded onto the bitline (illustrated in FIG. 9 as loading a "0" (e.g., loading a "0" onto the bitline from a buffer I/O component 432) before the precharged condition of bitline is affected by parasitic electronic effects).

At time 911, the JIT power conditions can be satisfied (e.g., as discussed herein above, WRITE ENABLE and ADDRESS signals are indicative that the buffer system is in a condition to write) and a wordline enable signal can be generated to facilitate completion of the memory operation. By generating a JIT ENABLE signal (e.g., a digital high signal), the wordline can be enabled and can energizing gate transistors that otherwise can isolate the buffer cell. This can connect the buffer cell 225 to the bitlines. Thereafter, the data on the bitlines (e.g., "0") can be written into the buffer cell 225. The JIT power component can then disable the wordline at a determined time after 912 (e.g., giving sufficient time for the data to be written into the memory cell) to conserve power by expending energy on wordline only so long as it is needed to perform the memory operation (e.g., "just in time").

A determined time after JIT ENABLE has been disabled, the precharge process can be initiated for the next cycle. In the next cycle a "1" will be written for exemplary purposes. At time 920, the PCB signal can be enabled isolating the bitlines in a precharged condition. Between time 920 and time 921 data can be loaded onto the bitlines before they can substantially decay as discussed herein above (here a "1" is loaded). At 921 the JIT power conditions can be satisfied and the wordline can be enabled allowing the data on the bitline to be written into the buffer cell 225. A determined time after 922 (e.g., once the data has been written), JIT power conditions can generate a wordline disable signal and the buffer cell 225 can be isolated with the newly written data.

For the third cycle in this example a "0" can be written. The precharge condition is initiated (e.g., PCB disabled (digital low)) at a time after 922 and the bitline can be placed in a precharged condition. At time 930 the precharge is completed and the bitline can be isolated from the precharge component by enabling PCB (e.g., digital high). Between time 930 and time 931 the "0" data is loaded onto the bitline. At time 931 the buffer cell 225 can be connected to the bitline by the JIT power component generating a wordline enable signal and the "0" can be written to the buffer cell 225. At a determined time after time 932, the JIT power component can disable the wordline and the buffer cell 225 can be isolated with the newly written data.

It will be appreciated by one of skill in the art that this timing sequence can be compressed, expanded, and/or altered to achieve specific design goals. For example, between each writing phase (e.g., 910-912, 920-922, and 930-932) the bitline can be held in a precharge condition, however this can be altered to allow precharging only for a short period before entering a write phase to conserve power. Moreover, one of skill in the art will appreciate that write operations can be followed with operations other than writes and a sequence of three write operations is only presented as an example for clarity. Also to be appreciated is that any data value (e.g., non-binary data, quantized charge potentials, . . . ) can be written in this manner and the disclosed subject matter is not limited to writing only binary data (e.g., "1" and "0").

Figure 10:
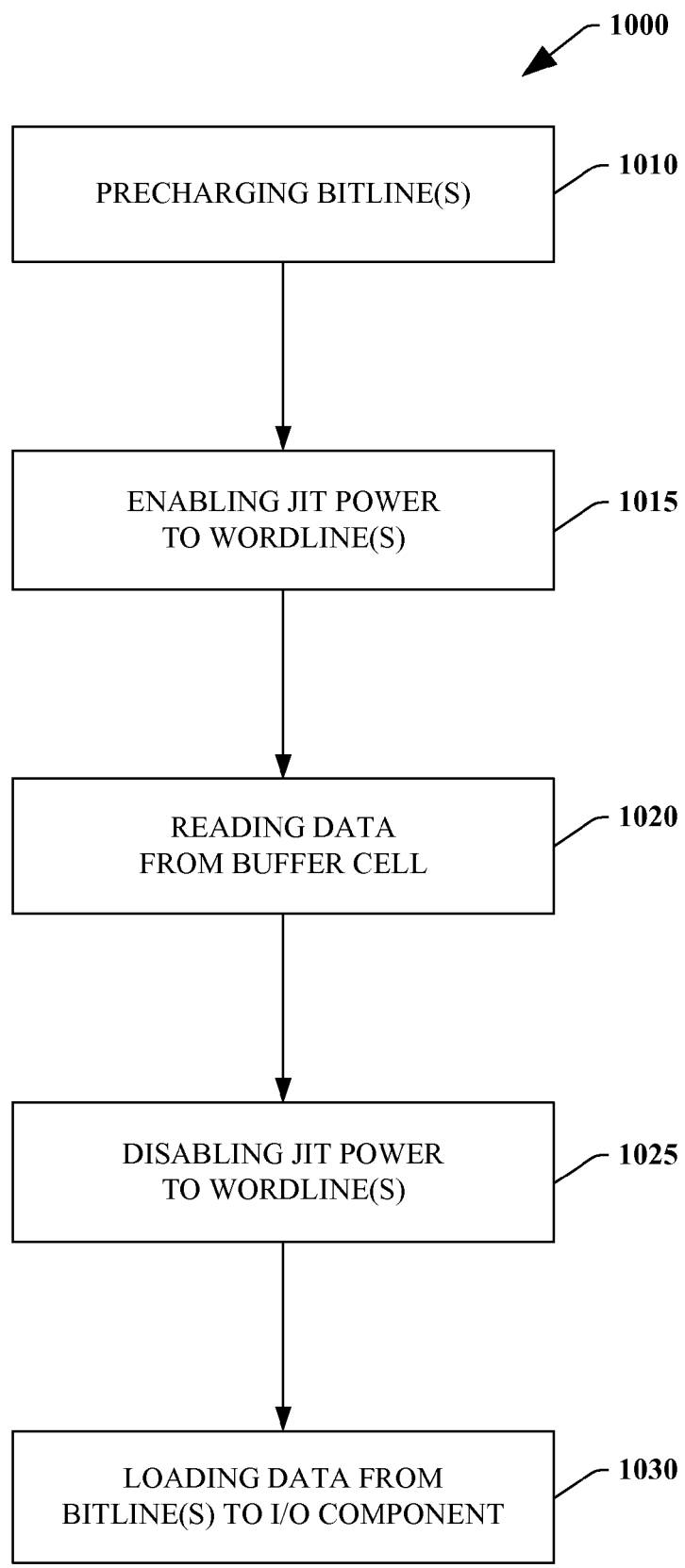
FIG. 10 illustrates a methodology that facilitates a read operation in accordance with an aspect of the disclosed subject matter.

Turning to FIG. 10, an exemplary read operation methodology 1000 in accordance with the disclosed subject matter is illustrated. A read operation methodology can facilitate reading data from a memory cell. In accordance with one aspect, at reference numeral 1010, bitlines can be precharged. The bitlines can be associated with a buffer cell(s) in an optimized buffer component 130 associated with a memory component 110. For example, a single PCB signal can be generated by a precharge component and in response a bitline precharge condition, a buffer Y-decoder precharge condition, and a buffer I/O precharge condition, among others, can be effected in order to facilitate reducing errors associated with parasitic electronic effects as described herein. Once precharging has occurred the data access line (e.g., bitline) can be isolated from the precharge component and allowed to float in a precharged condition as discussed herein. Also as discussed herein, while floating, the bitline can be subject to parasitic electrical effects. Where a precharge action employing, for example, a single PCB signal is employed, as herein disclosed, error propagation associated with complex timing schema and parasitic electronic effects can be reduced.

At reference numeral 1015, a wordline can be enabled. For example, a JIT power component 260 can enable a wordline, wherein JIT power conditions are satisfied (e.g., READ ENABLE and ADDRESS signals indicate that a read operation is in a ready condition to proceed), can enable an access enable line (e.g., a wordline). At reference numeral 1020, the enabled access enable line (e.g., a wordline) can facilitate conductively coupling a buffer cell to data access lines (e.g., bitlines) such that data can be loaded from the buffer cell onto the precharged bitlines. At 1025, the buffer cell can be isolated from the bitlines, for example, by disabling the wordline enable signal. The bitlines can reflect the data condition of the buffer cell (e.g., data has been read out of the buffer cell onto the bitlines). At 1030, data on the bitlines can be read out to, for example, a buffer I/O component 432. By employing a JIT power control action, the buffer cell 225 can be conductively coupled to a data access line for only so long as needed to proceed with the memory operation (e.g., read) and thereby power consumption can be reduced as herein disclosed. Further, as herein disclosed, employing "just in time" power control of a wordline can reduce thermal loading associated with reduced power consumption. At this point, methodology 1000 can end.

Figure 11:
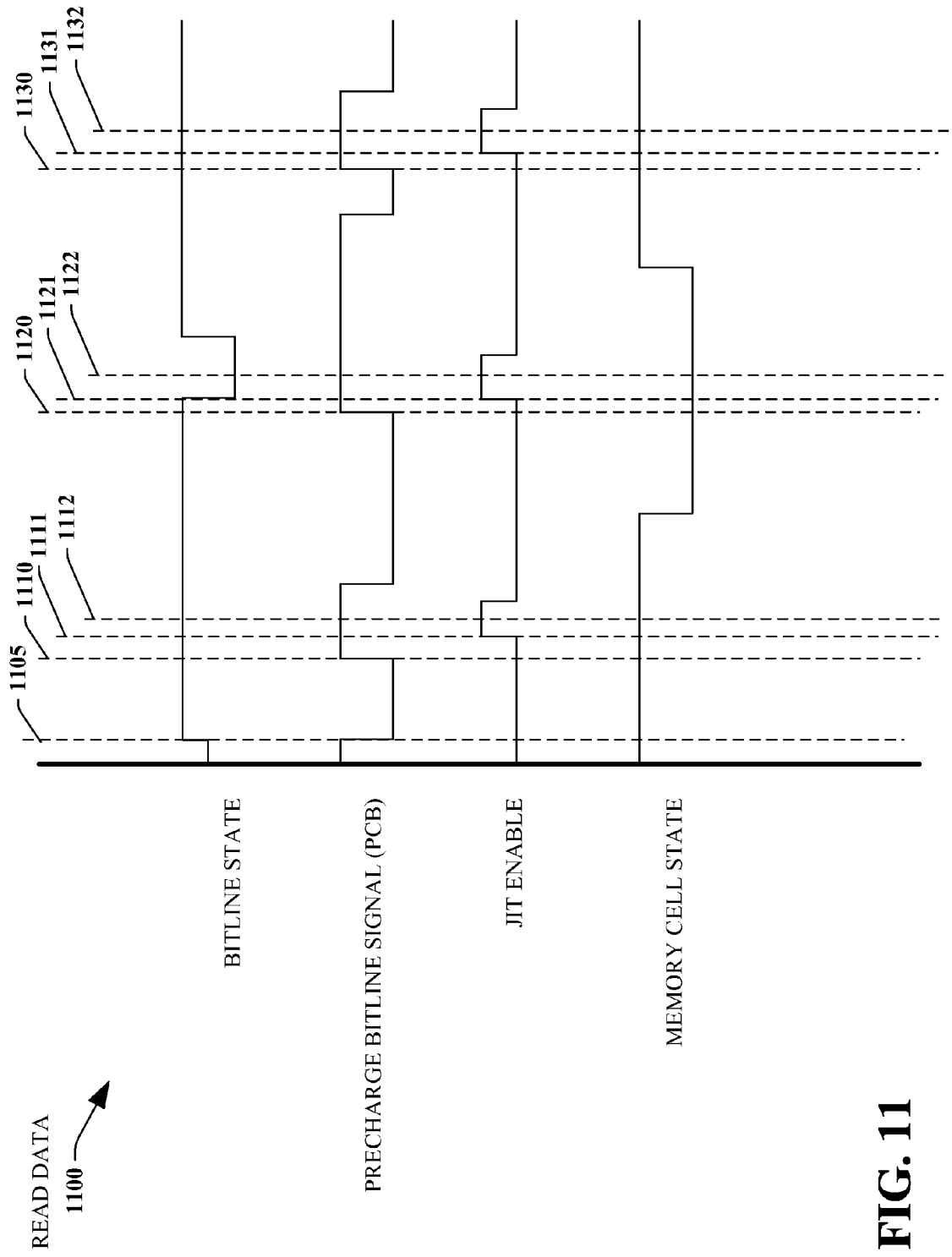
FIG. 11 depicts an exemplary timing diagram that illustrates aspects of a read operation in accordance with an aspect of the disclosed subject matter.

Referring to FIG. 11, an exemplary timing diagram 1100 is depicted to help illustrate aspects of timing a read operation method, for example the methodology 1000 (see FIG. 10), in accordance with at least one aspect of the disclosed subject matter. For clarity the diagram 1100 is entirely described as a single example wherein a precharge component circuit can be defined as a simple PMOS gate as hereinabove described. Therefore, when a PCB signal is disabled (e.g., digital low) the precharge component circuit can be precharging and when PCB signal is enabled (e.g., digital high) the PMOS can be non-conductive and can isolate the precharge component from the data access lines (e.g., bitlines).

The access data line state (e.g., bitline state), for example, can be undefined as illustrated before time 1105, because the PCB signal is enabled and the bitline is therefore isolated from the bitline precharge component 410 through the PMOS as given herein. Further, before time 1105, a JIT power component 260 can be generating a wordline disable signal (e.g., JIT ENABLE is low) because power to the wordline is not needed to proceed with a memory operation as discussed herein above (e.g., READ ENABLE and ADDRESS signal conditions effect a WORDLINE disable signal from a JIT power component).

At time 1105, the precharge component 250 can generate (or receive) a PCB signal and the bitline precharge component 410 related to precharging the bitlines can effect a precharge condition on the bitline by turning on the exemplary PMOS precharge circuit, in accord with this particular example of the disclosed subject matter. As a result, at time 1105, the bitline can rise to a defined precharge state (e.g., Vcc) which can facilitate reducing errors that can be associated with writing data to a bitline when it is in an undefined state. The currently disabled state of the wordline can keep the buffer cell 225 isolated from the bitlines. The isolated memory cell can therefore maintain its current value(s) and can be insensitive to changes in the bitline state.

At time 1110, the PCB signal can be switched to disable (e.g., PCB goes high) causing the bitline to become isolated from the bitline precharge component 410 and enter a floating state as described herein. In this floating state the charge condition applied to the bitline between time 1105 and time 1110 can remain but will be subject to parasitic electronic effects which over time can cause the bitline state to drift into an undefined state (not illustrated).

At time 1111, the JIT component 260 can, in response to memory operation conditions becoming satisfied (e.g., READ ENABLE and ADDRESS signal lines are in a condition indicating that the read operation is in a condition to proceed), enable WORDLINE and can cause the buffer cell 225 to become conductively coupled to the data access lines (e.g., bitlines) allowing data to be loaded from the buffer cell 225 onto the bitlines (illustrated in FIG. 11 as loading a "1" (e.g., onto the bitline from a buffer cell 225) before the precharged condition of bitline is affected by parasitic electronic effects).

At a determined time after time 1112 (e.g., allowing time for the data to be loaded onto the bitlines from the buffer cell 225) the wordline can be disabled by the JIT component 260 isolating the buffer cell 225 and preserving the data therein in a manner that can reduce power consumption and thermal loading as hereinabove disclosed. The bitlines can then be read out to, for example, a buffer I/O component 432.

For the next read cycle, a determined time after JIT ENABLE has been disabled, the precharge process can be initiated (e.g., precharging can begin before time 1120). In this read cycle a "0" can be read from a buffer cell (for clarity and brevity it is not illustrated how the buffer cell 225 now contains a "0" to be read out). At a time before time 1120, a bitline can be placed in a precharge condition to facilitate reduced error propagation associated with parasitic electronic effects and complex timing schema as herein above disclosed. At time 1120, the bitline precharge component 410 can be isolated from the bitlines and the bitlines can float in a precharged condition. At time 1121, the JIT power component 260 can enable the wordline, connecting the buffer cell 225 to the bitlines so that data can be loaded onto the bitlines from the buffer cell 225. At a determined time after time 1122 (e.g., allowing time for the data to be loaded onto the bitlines from the buffer cell 225) the JIT power component 260 can disable the wordline isolating the buffer cell 225 from the bitline in a manner that reduces power consumption and thermal loading as herein described. The bitline can then be read out to, for example, the buffer I/O component 432.

For a third read cycle, a "1" can be read from the buffer cell 225 (for clarity and brevity it is not illustrated how the buffer cell 225 now contains a "1" to be read out). The bitlines can be placed in a precharged condition prior to time 1130. At time 1130, the bitlines can be isolated from the bitline precharge component 410 and can be placed in a floating condition. At time 1131, the JIT power component 260 can enable the wordline and data can be read from the buffer cell 225 onto the bitlines. At a desired point in time after time 1132, the wordline can be disabled by the JIT power component 260 to isolate the buffer cell 225 and preserve its data. The bitlines can then be read out to, for example, the buffer I/O component 432.

It will be appreciated by one of skill in the art that this timing sequence can be compressed, expanded, and/or altered to achieve specific design goals. For example, between each reading phase (e.g., 1110-1112, 1120-1122, and 1130-1132) the bitline can be held in a precharge condition, however this can be altered to allow precharging only for a short period before entering a read phase to conserve power. Moreover, one of skill in the art will appreciate that read operations can be followed with operations other than reads and a sequence of three read operations is only presented as an example for clarity. Also to be appreciated is that any data value (e.g., non-binary data, quantized charge potentials, . . . ) can be read in this manner and the disclosed subject matter is not limited to reading only binary data (e.g., "1" and "0").

Referring to FIG. 12, illustrated is a block diagram of an exemplary, non-limiting electronic device 1200 that can include a memory device that can store data in accordance with one aspect of the disclosed subject matter. The electronic device 1200 can include, but is not limited to, a computer, a laptop computer, network equipment (e.g. routers, access points), a media player and/or recorder (e.g., audio player and/or recorder, video player and/or recorder), a television, a smart card, a phone, a cellular phone, a smart phone, an electronic organizer, a PDA, a portable email reader, a digital camera, an electronic game (e.g., video game), an electronic device associated with digital rights management, a Personal Computer Memory Card International Association (PCMCIA) card, a trusted platform module (TPM), a Hardware Security Module (HSM), set-top boxes, a digital video recorder, a gaming console, a navigation system (e.g., global position satellite (GPS) system), secure memory devices with computational capabilities, devices with tamper-resistant chips, an electronic device associated with an industrial control system, an embedded computer in a machine (e.g., an airplane, a copier, a motor vehicle, a microwave oven), and the like.

Components of the electronic device 1200 can include, but are not limited to, a processor component 1202, a system memory 1204 (with nonvolatile memory 1206), and a system bus 1208 that can couple various system components including the system memory 1204 to the processor component 1202. The system bus 1208 can be any of various types of bus structures including a memory bus or memory controller, a peripheral bus, or a local bus using any of a variety of bus architectures.

Electronic device 1200 can typically include a variety of computer readable media. Computer readable media can be any available media that can be accessed by the electronic device 1200. By way of example, and not limitation, computer readable media can comprise computer storage media and communication media. Computer storage media can include volatile, non-volatile, removable, and non-removable media that can be implemented in any method or technology for storage of information, such as computer readable instructions, data structures, program modules or other data. Computer storage media includes, but is not limited to, RAM, ROM, EEPROM, nonvolatile memory 1206 (e.g., flash memory), or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by electronic device 1200. Communication media typically can embody computer readable instructions, data structures, program modules or other data in a modulated data signal such as a carrier wave or other transport mechanism and includes any information delivery media.

The system memory 1204 can include computer storage media in the form of volatile and/or nonvolatile memory 1206 (e.g., memory component 110, optimized buffer component 130, memory system 100, optimized buffer system 200, adapted versions of generic memory system 300, etc.). A basic input/output system (BIOS), containing the basic routines that help to transfer information between elements within electronic device 1200, such as during start-up, can be stored in memory 1204. Memory 1204 can typically contain data and/or program modules that can be immediately accessible to and/or presently be operated on by processor component 1202. By way of example, and not limitation, system memory 1204 can also include an operating system, application programs, other program modules, and program data.

The nonvolatile memory 1206 can be removable or non-removable. For example, the nonvolatile memory 1206 can be in the form of a removable memory card or a USB flash drive. In accordance with one aspect, the nonvolatile memory 1206 can include flash memory (e.g., single-bit flash memory, multi-bit flash memory), ROM, PROM, EPROM, EEPROM, or NVRAM (e.g., FeRAM), or a combination thereof, for example. Further, the flash memory can be comprised of NOR flash memory and/or NAND flash memory.

A user can enter commands and information into the electronic device 1100 through input devices (not shown) such as a keypad, microphone, tablet or touch screen although other input devices can also be utilized. These and other input devices can be connected to the processor component 1202 through input interface component 1120 that can be connected to the system bus 1208. Other interface and bus structures, such as a parallel port, game port or a universal serial bus (USB) can also be utilized. A graphics subsystem (not shown) can also be connected to the system bus 1208. A display device (not shown) can be also connected to the system bus 1208 via an interface, such as output interface component 1212, which can in turn communicate with video memory. In addition to a display, the electronic device 1200 can also include other peripheral output devices such as speakers (not shown), which can be connected through output interface component 1212.

It is to be understood and appreciated that the computer-implemented programs and software can be implemented within a standard computer architecture. While some aspects of the disclosure have been described above in the general context of computer-executable instructions that may run on one or more computers, those skilled in the art will recognize that the technology also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices (e.g., PDA, phone), microprocessor-based or programmable consumer electronics, and the like, each of which can be operatively coupled to one or more associated devices.

The illustrated aspects of the disclosure may also be practiced in distributed computing environments where certain tasks are performed by remote processing devices that are linked through a communications network. In a distributed computing environment, program modules can be located in both local and remote memory storage devices.

As utilized herein, terms "component," "system," "interface," and the like, can refer to a computer-related entity, either hardware, software (e.g., in execution), and/or firmware. For example, a component can be, but is not limited to being, a process running on a processor, a processor, a circuit, a collection of circuits, an object, an executable, a thread of execution, a program, and/or a computer. By way of illustration, both an application running on a server and the server can be a component. One or more components can reside within a process and a component can be localized on one computer and/or distributed between two or more computers.

The disclosed subject matter can be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications can be made to this configuration without departing from the scope or spirit of the disclosed subject matter.

Some portions of the detailed description have been presented in terms of algorithms and/or symbolic representations of operations on data bits within a computer memory. These algorithmic descriptions and/or representations are the means employed by those cognizant in the art to most effectively convey the substance of their work to others equally skilled. An algorithm is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the foregoing discussion, it is appreciated that throughout the disclosed subject matter, discussions utilizing terms such as processing, computing, calculating, determining, and/or displaying, and the like, refer to the action and processes of computer systems, and/or similar consumer and/or industrial electronic devices and/or machines, that manipulate and/or transform data represented as physical (electrical and/or electronic) quantities within the computer's and/or machine's registers and memories into other data similarly represented as physical quantities within the machine and/or computer system memories or registers or other such information storage, transmission and/or display devices.

Artificial intelligence based systems (e.g., explicitly and/or implicitly trained classifiers) can be employed in connection with performing inference and/or probabilistic determinations and/or statistical-based determinations as in accordance with one or more aspects of the disclosed subject matter as described herein. As used herein, the term "inference," "infer" or variations in form thereof refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the disclosed subject matter.

For example, an artificial intelligence based system can evaluate current or historical evidence associated with error propagation (e.g., error patterns correlated with the size of data blocks read and/or written, errors associated with specific electronic devices reading and/or writing to memory device using a memory system 100 employing optimized buffer system 200, errors related to specific sequences of reads and/or writes, errors related to reading and/or writing to specific blocks of buffer and/or core memory, . . . ) and/or power consumption (e.g., data from self diagnostics of timing schema, data related to available power resources, data on thermal conditions in various environments, . . . ), and based in part in such evaluation, can render an inference, based in part on probability, regarding, for instance, increasing/decreasing precharge time, precharging more or fewer signal paths, adjusting precharging timing to allow longer precharge phases on selected portions of a buffer array component, enabling wordline earlier/later based in part on available power and/or thermal conditions, combinations thereof and others. One of skill in the art will appreciate that intelligent and/or inferential systems can facilitate further optimization of the disclosed subject matter and such inferences can be based on a large plurality of data and variables all of with are considered within the scope of the subject innovation.

What has been described above includes examples of aspects of the disclosed subject matter. It is, of course, not possible to describe every conceivable combination of components or methodologies for purposes of describing the disclosed subject matter, but one of ordinary skill in the art will recognize that many further combinations and permutations of the disclosed subject matter are possible. Accordingly, the disclosed subject matter is intended to embrace all such alterations, modifications and variations that fall within the spirit and scope of the appended claims. Furthermore, to the extent that the terms "includes," "has," or "having," or variations thereof, are used in either the detailed description or the claims, such terms are intended to be inclusive in a manner similar to the term "comprising" as "comprising" is interpreted when employed as a transitional word in a claim.

What is claimed is:

1. A system that facilitates access of data associated with a memory, comprising:
   an optimized buffer component comprising a plurality of buffer cells that can store data to facilitate access of data associated with the memory; and
   at least one precharge component that can generate a single precharge control signal that establishes a respective precharged state on two or more data access lines within the optimized buffer component to facilitate access of one or more buffer cells of the plurality of buffer cells.

2. The system of claim 1, the at least one precharge component is communicatively coupled to at least one of the data access lines selectively associated with at least one buffer cell of the plurality of buffer cells.

3. The system of claim 1, the optimized buffer component further comprises:
   at least one buffer cell address decoder, wherein the at least one precharge component is further communicatively coupled to at least one signal conductor path through the at least one buffer cell address decoder and generates at least one precharged state thereon.

4. The system of claim 3, the at least one buffer cell address decoder is a tree-type decoder.

5. The system of claim 4, the optimized buffer component further comprises:
   at least one input/output sensor component, wherein the at least one precharge component is further communicatively coupled to at least one signal conductor path of the at least one input/output sensor component and generates at least one precharged state thereon.

6. The system of claim 1, wherein a data access line associated with the optimized buffer component is precharged to facilitate reducing errors associated with parasitic electronic effects during an operation associated with the optimized buffer component, the operation comprising at least one of a read, a write, a refresh, an update, or an erase, or a combination thereof.

7. The system of claim 1, further comprising a memory component that is associated with the optimized buffer component, wherein the optimized buffer component facilitates the execution of operations associated with the memory component.

8. The system of claim 7, the memory component is at least one a nonvolatile memory or a volatile memory.

9. The system of claim 1, further comprising:
   a just-in-time power component that provides an enabling signal to at least one wordline associated with at least one buffer cell of the plurality of buffer cells in response to part upon at least one of an address signal, a write enable signal, or a read enable signal, or a combination thereof, received by the just-in-time power component in order to facilitate reducing power consumption associated with an operation associated with the at least one buffer cell.

10. The system of claim 9, the enabling signal is provided for a period of time, the period of time is based on the amount of time required for access of the at least one buffer cell in order to perform an operation.

11. The system of claim 10, the enabling signal is determined according to a logic equation: WORDLINE=!{ADDRESS NAND (![WRITE_ENABLE NOR READ_ENABLE])}, wherein WORDLINE is the enable signal, ADDRESS is the address signal, WRITE_ENABLE is the write enable signal, and READ_ENABLE is the read enable signal.

12. An electronic device comprising at least a portion of the system of claim 1.

13. The electronic device of claim 12, wherein the electronic device comprises at least one of a computer, a laptop computer, network equipment, a media player, a media recorder, a television, a smart card, a phone, a cellular phone, a smart phone, an electronic organizer, a personal digital assistant, a portable email reader, a digital camera, an electronic game, an electronic device associated with digital rights management, a Personal Computer Memory Card International Association (PCMCIA) card, a trusted platform module (TPM), a Hardware Security Module (HSM), set-top boxes, a digital video recorder, a gaming console, a navigation system, a secure memory device with computational capabilities, a device with at least one tamper-resistant chip, an electronic device associated with industrial control systems, or an embedded computer in a machine, or a combination thereof, wherein the machine comprises one of an airplane, a copier, a motor vehicle, or a microwave oven.

14. The system of claim 1 wherein the precharge component can receive an externally generated precharge control signal and apply the signal to establish a respective a precharged state on two or more data access lines within the optimized buffer component to facilitate access of one or more buffer cells of the plurality of buffer cells.

15. The system of claim 14 the precharge component receives precharge control signals from at least one of an external precharge control signal generator, another optimized buffer component, or other precharge components of the system.

16. The system of claim 5, the single precharge control signal substantially simultaneously establishes a different precharged state on at least one of a bitline of the buffer component, the tree-type decoder component, or at least one input/output sensor component.

17. The system of claim 4 the single precharge control signal substantially simultaneously establishes a different precharged state on one or more nodes associated with the tree-type decoder component.

18. A system that facilitates access of data associated with a memory, comprising:
an optimized buffer component comprising a plurality of buffer cells that can store data to facilitate access of data associated with the memory; and
a just-in-time power component that provides an enabling signal to at least one wordline associated with at least one buffer cell of the plurality of buffer cells in response to at least one of an address signal, a write enable signal, or a read enable signal, or a combination thereof, received by the just-in-time power component in order to facilitate reducing power consumption associated with an operation associated with the at least one buffer cell.

19. The system of claim 18, the enabling signal is provided for a period of time, the period of time is based on the an amount of time required for access of the at least one buffer cell in order to perform an operation.

20. The system of claim 19, the enabling signal is determined according to a logic equation: WORDLTNE=!{ADDRESS NAND (![WRITE_ENABLE NOR READ_ENABLE])}, wherein WORDLINE is the enabling signal, ADDRESS is the address signal, WRITE_ENABLE is the write enable signal, and READ_ENABLE is the read enable signal.

* * * * *